(12) United States Patent
Adkisson et al.

(10) Patent No.: US 7,382,847 B2
(45) Date of Patent: Jun. 3, 2008

(54) PROGRAMMABLE SYNC PULSE GENERATOR

(75) Inventors: Richard W. Adkisson, Dallas, TX (US); Ryan L. Akkerman, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 665 days.

(21) Appl. No.: 10/898,404

(22) Filed: Jul. 23, 2004

(65) Prior Publication Data
US 2006/0018416 A1    Jan. 26, 2006

(51) Int. Cl.
  *H04L 25/00* (2006.01)
  *H04L 7/00* (2006.01)
(52) U.S. Cl. ..................... 375/371; 375/354
(58) Field of Classification Search ................. 375/371, 375/375, 376, 327, 355, 354; 327/3, 9; 331/17, 331/19, 25; 713/400
See application file for complete search history.

(56) References Cited

U.S. PATENT DOCUMENTS

| | | | |
|---|---|---|---|
| 5,347,559 A | 9/1994 | Hawkins et al. | |
| 5,721,886 A | 2/1998 | Miller | |
| 5,920,213 A | 7/1999 | Graf, III | |
| 5,923,195 A | 7/1999 | Graf, III | |
| 6,075,832 A | 6/2000 | Geannopoulos et al. | |
| 6,084,447 A | 7/2000 | Graf, III | |
| 6,084,934 A | 7/2000 | Garcia et al. | |
| 6,114,915 A | 9/2000 | Huang et al. | |
| 6,134,155 A | 10/2000 | Wen | |
| 6,175,603 B1 | 1/2001 | Chapman et al. | |
| 6,246,275 B1 | 6/2001 | Wodnicki et al. | |
| 6,249,875 B1 | 6/2001 | Warren | |
| 6,326,824 B1 | 12/2001 | Hosoe et al. | |
| 6,369,624 B1 | 4/2002 | Wang et al. | |
| 6,529,083 B2 | 3/2003 | Fujita | |
| 6,587,534 B2 * | 7/2003 | Hassoun et al. | 375/376 |
| 6,718,477 B1 | 4/2004 | Plants et al. | |
| 6,759,881 B2 | 7/2004 | Kizer et al. | |
| 7,102,402 B2 * | 9/2006 | Kurd et al. | 327/158 |
| 7,102,406 B2 * | 9/2006 | Ishihara | 327/200 |
| 7,119,582 B2 * | 10/2006 | Adkisson | 327/3 |
| 2002/0051509 A1 | 5/2002 | Lindner et al. | |
| 2002/0158671 A1 | 10/2002 | Wang et al. | |
| 2002/0199124 A1 | 12/2002 | Adkisson | |

\* cited by examiner

*Primary Examiner*—Khai Tran

(57) ABSTRACT

A programmable sync pulse generator and sync pulse generation method are operable in a clock synchronizer to effectuate data transfer between first circuitry disposed in a first clock domain and second circuitry disposed in a second clock domain. The first clock domain is operable with a first clock signal and the second clock domain is operable with a second clock signal. A phase detection circuitry is operable to sample the first clock signal with the second clock signal to determine coincident edges of the first and second clock signals. Validation circuitry is operable to validate the coincident edges based upon skew tolerance between the first and second clock signals and to generate a valid edge signal responsive thereto. Sync generation circuitry, responsive to the valid edge signal, is operable to generate synchronization pulses in the first clock domain and synchronization pulses in the second clock domain.

38 Claims, 17 Drawing Sheets

| | 0-rp4 | 1-rp3 | 2-rp2 | 3-rp1 | 0-r0 | 1-rm1 | 2-rm2 | 3-rm3 | Skew (ns) | Link Clk | General |
|---|---|---|---|---|---|---|---|---|---|---|---|
| 610r | 1 | 0 | 0 | 1 | 1 | 0 | 0 | 1 | +1.125 | +3/8 | link - core/2 |
| 612r | 1 | X | 0 | X | 1 | X | 0 | X | +0.75 | +2/8 | core - link |
| 614r | 1 | 1 | 0 | 0 | 1 | 1 | 0 | 0 | +0.375 | +1/8 | core/2 - link/2 |
| 602r | X | 1 | X | 0 | X | 1 | X | 0 | 0 | 0 | 0 |
| 622r | 0 | 1 | 1 | 0 | 0 | 1 | 1 | 0 | -0.375 | -1/8 | link/2 - core/2 |
| 624r | 0 | X | 1 | X | 0 | X | 1 | X | -0.75 | -2/8 | link - core |
| 626r | 0 | 0 | 1 | 1 | 0 | 0 | 1 | 1 | -1.125 | -3/8 | core/2 - link |

| | 0-fp4 | 1-fp3 | 2-fp2 | 3-fp1 | 0-f0 | 1-fm1 | 2-fm2 | 3-fm3 | Skew (ns) | Link Clk | General |
|---|---|---|---|---|---|---|---|---|---|---|---|
| 610f | X | 1 | X | 0 | X | 1 | X | 0 | +1.125 | +3/8 | link - core/2 |
| 612f | 0 | 1 | 1 | 0 | 0 | 1 | 1 | 0 | +0.75 | +2/8 | core - link |
| 614f | 0 | X | 1 | X | 0 | X | 1 | X | +0.375 | +1/8 | core/2 - link/2 |
| 602f | 0 | 0 | 1 | 1 | 0 | 0 | 1 | 1 | 0 | 0 | 0 |
| 622f | X | 0 | X | 1 | X | 0 | X | 1 | -0.375 | -1/8 | link/2 - core/2 |
| 624f | 1 | 0 | 0 | 1 | 1 | 0 | 0 | 1 | -0.75 | -2/8 | link - core |
| 626f | 1 | X | 0 | X | 1 | X | 0 | X | -1.125 | -3/8 | core/2 - link |

FIG. 7B

| rp1 | r0 | rm1 | rm2 | fp2 | fp1 | f0 | fm1 | WFZ & WFZ2 | SS & SS2 | Skew (ns) | Link Clk | General |
|---|---|---|---|---|---|---|---|---|---|---|---|---|
| 1 |   |   |   |   |   |   |   |   |   | +1.125 | +3/8 | link - core/2 |
| 1 | 1 |   |   |   |   |   |   |   |   |   |   |   |
| X | 1 |   |   | X | 1 |   |   |   |   |   |   |   |
|   | 1 | 1 |   |   | 1 | 1 | 1 | 1 |   | +0.75 | +2/8 | core - link |
|   | X | 1 |   |   | X | 1 | 1 | 1 |   |   |   |   |
|   |   | 1 | 1 |   |   | 1 | 1 | 1 | 1 | +0.375 | +1/8 | core/2 - link/2 |
|   |   | 1 | 1 |   |   | X | 1 | 1 | 1 | 0 | 0 | 0 |
|   |   | X | 1 |   |   |   | X | 1 | 1 | -0.375 | -1/8 | link/2 - core/2 |
|   |   |   |   |   |   |   |   |   |   | -0.75 | -2/8 | link - core |
|   |   |   |   |   |   |   |   |   |   | -1.125 | -3/8 | core/2 - link |

PROGRAMMABLE SYNC PULSE GENERATOR

CROSS-REFERENCE TO RELATED APPLICATION(S)

This application discloses subject matter related to the subject matter disclosed in the following commonly owned co-pending patent applications: (i) "PHASE DETECTION IN SYNC PULSE GENERATOR," filed Jul. 23, 2004; application Ser. No. 10/898,693, in the name(s) of: Richard W. Adkisson; (ii) "DRIFT-TOLERANT SYNC GENERATION CIRCUIT FOR A SYNC PULSE GENERATOR," filed Jul. 23, 2004; application Ser. No. 10/897,729, in the name(s) of: Richard W. Adkisson; (iii) "PROGRAMMABLE CLOCK SYNCHRONIZER," filed Jul. 30, 2003; application Ser. No. 10/630,159, in the name(s) of: Richard W. Adkisson; and (iv) "PHASE DETECTOR FOR A PROGRAMMABLE CLOCK SYNCHRONIZER," filed Jul. 30, 2003; application Ser. No. 10/630,298, in the name(s) of: Richard W. Adkisson, all of which are hereby incorporated by reference for all purposes.

BACKGROUND

Digital electronic systems, e.g., computer systems, often need to communicate using different interfaces, each running at an optimized speed for increased performance. Typically, multiple clock signals having different frequencies are utilized for providing appropriate timing to the interfaces. Further, the frequencies of such clock signals are generally related to one another in a predetermined manner. For example, a link or system clock running at a particular frequency ($F_1$) may be utilized as a master clock in a typical computer system for providing a time base with respect to a specific portion of its digital circuitry. Other portions of the computer system's digital circuitry (such as a core segment and the logic circuitry disposed thereon) may be clocked using timing signals derived from the master clock wherein the derived frequencies ($F_d$) follow the relationship: $F_1/F_d > 1$.

Because of the asynchronous—although related—nature of the constituent digital circuit portions, synchronizer circuitry is often used in computer systems to synchronize data transfer operations across a clock domain boundary so as to avoid timing-related data errors. Such synchronizer circuitry is typically required to possess low latency (which necessitates precise control of the asynchronous clocks that respectively clock the circuit portions in two different clock domains). Typically, phase-locked loops (PLLs) are utilized in conventional synchronizer circuitry arrangements to produce clocks of different yet related frequencies. Synchronization pulse generation having phase detection capability and drift tolerance would be beneficial in applications where PLLs are deficient.

SUMMARY

A programmable sync pulse generator and sync pulse generation method are disclosed that are operable in a clock synchronizer to effectuate data transfer between first circuitry disposed in, a first clock domain and second circuitry disposed in a second clock domain. The first clock domain is operable with a first clock signal and the second clock domain is operable with a second clock signal. A phase detection circuitry is operable to sample the first clock signal with the second clock signal to determine coincident edges of the first and second clock signals. Validation circuitry is operable to validate the coincident edges based upon skew tolerance between the first and second clock signals and to generate a valid edge signal responsive thereto. Sync generation circuitry, responsive to the valid edge signal, is operable to generate synchronization pulses in the first clock domain and synchronization pulses in the second clock domain.

BRIEF DESCRIPTION OF THE DRAWINGS

FIG. 7A depicts a table further illustrating the different skews associated with rising clock edges of the clock signals;

FIG. 7B depicts a table further illustrating the different skews associated with falling clock edges of the clock signals;

FIG. 8 depicts a table illustrating the different skews associated with the rising and falling clock edges relative to operational modes of the validation circuitry;

DETAILED DESCRIPTION OF THE DRAWINGS

Figure 1:
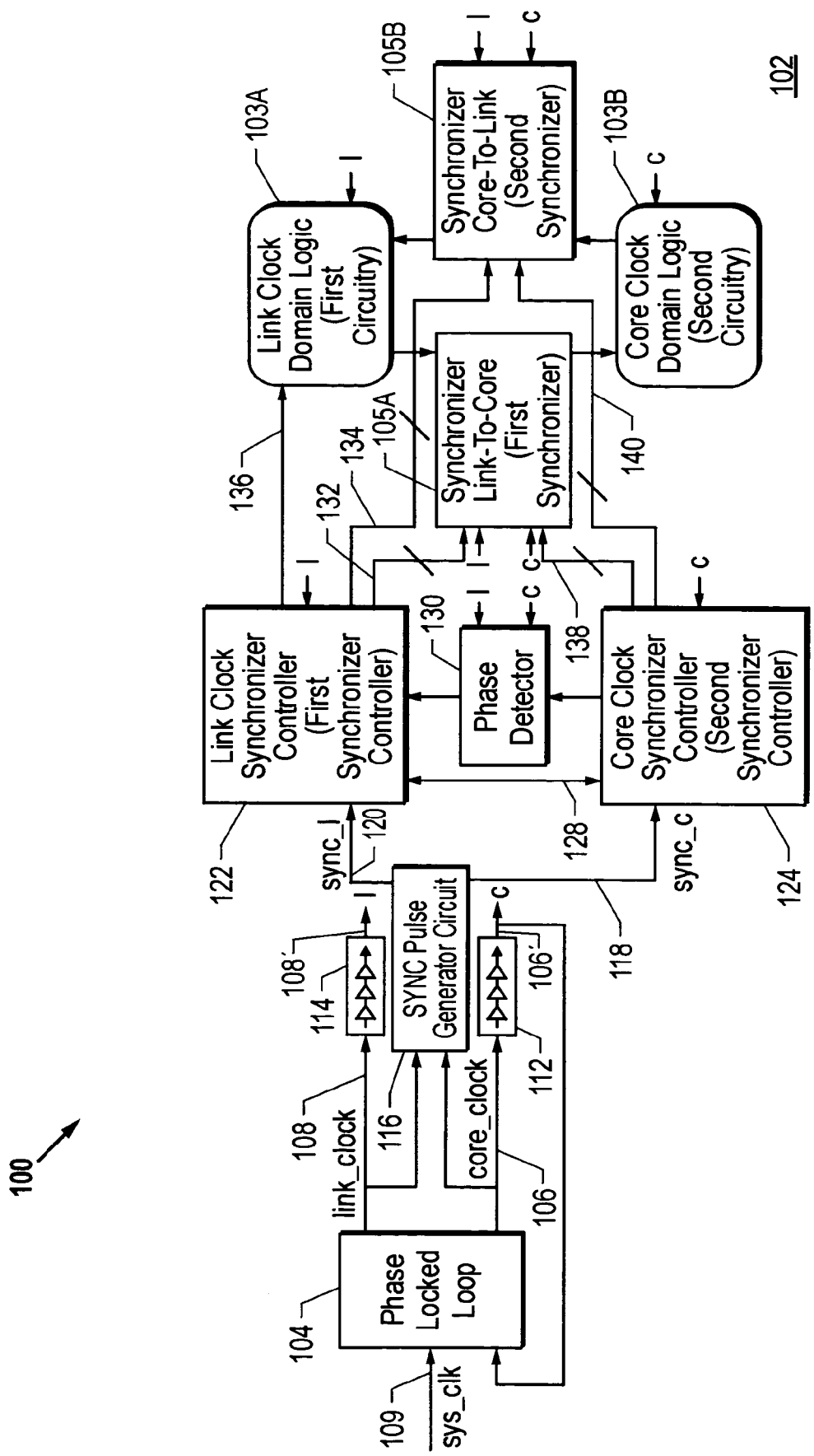
FIG. 1 depicts a block diagram of an embodiment of a synchronizer system for effectuating data transfer across a clock boundary.

In the drawings, like or similar elements are designated with identical reference numerals throughout the several views thereof, and the various elements depicted are not necessarily drawn to scale. Referring now to FIG. 1, therein is depicted an embodiment of a synchronizer system 100 for effectuating data transfer across a clock boundary between a first clock domain (i.e., "fast clock domain") having N clock cycles and a second clock domain (e.g., "slow clock domain") having M clock cycles such that N/M>1. Typically, M=(N−1), and by way of exemplary implementation, the synchronizer system 100 may be provided as part of a computer system for transferring data between a faster clock domain (e.g., operating with a link clock signal of 333 MHz) and a slower clock domain (e.g., operating with a core clock signal of 267 MHz), with a 5:4 frequency ratio. Accordingly, for purposes of this present patent application, the terms "first clock" and "link clock" will be used synonymously with respect to a fast clock domain; likewise, the terms "second clock" and "core clock" will be used with respect to a slow clock domain. It should be appreciated, however, that the synchronizer pulse generator (or, sync pulse generator) described herein may have applications with respect to other clock domains, such as a core clock/bus clock domain interface, for example.

A phase-locked loop (PLL) circuit 104 is operable to generate a link clock (i.e., first clock) signal 108 (designated as link_clock) based on a system clock 109 (designated as sys_clk) provided thereto. The PLL circuit 104 is also operable to generate a core clock (i.e., second clock) signal 106 (designated as core_clock) based on the system clock signal. Each of the core_clock 106 and link_clock signals 108 is first provided to a respective clock distribution tree block for generating a distributed clock signal that is provided to various parts of a synchronizer/controller block 102 provided for the synchronizer system 100. Reference numeral 112 refers to the clock distribution tree operable with the core_clock signal 106 to generate the distributed core_clock signal, which is labeled as "c" and shown with reference numeral 106' in FIG. 1. Likewise, reference numeral 114 refers to the clock distribution tree 114 operable with the link_clock signal 108 to generate the distributed link_clock signal, which is labeled as "1" and shown with reference numeral 108' in FIG. 1. As one skilled in the art should readily recognize, the distributed clock signals are essentially the same as the input clock signals. Accordingly, the system clock signal 109, core_clock signal 106 and its distributed counterpart c 106' are treated equivalently hereinafter. Also, the link_clock signal 108 and its distributed counterpart 1 108' are similarly treated as equivalent.

A synchronization (SYNC) pulse generation circuit 116 is operable responsive to the clock signals 106, 108, to generate a pair of SYNC pulses that are forwarded to appropriate domains of the synchronizer controller circuitry. The SYNC pulses, which are designated sync_c 118 and sync_1 120, provide a reference point for coordinating data transfer operations and are driven HIGH when the link_clock and core_clock signals have coincident rising edges. The two clock signals 106, 108 and SYNC pulse signals are provided to the synchronizer/controller block 102 that straddles the clock boundary between the first clock domain (i.e., link clock domain) and the second clock domain (i.e., core clock domain) for effectuating data transfer across the boundary. Reference numerals 103A and 103B refer to circuitry disposed in the first and second clock domains, respectively, e.g., link clock domain logic and core clock domain logic, that transmit and receive data therebetween as facilitated via synchronizers 105A and 105B, which will be described in greater detail hereinbelow.

A link clock synchronizer controller 122 is operable responsive to the distributed link_clock, 1 108', and sync_1 pulse 120 to generate a plurality of synchronizer control signals, a portion of which signals are directed to a first synchronizer circuit means 105A operating to control data transfer from first circuitry 103A (i.e., link clock domain logic) to second circuitry 103B (i.e., core clock domain logic). Reference numeral 132 refers to the signal path of this portion of control signals emanating from the link clock synchronizer controller 122. Another portion of the synchronizer control signals generated by the link clock synchronizer controller 122 are directed (via signal path 134) to a second synchronizer circuit means 105B operating to control data transfer from second circuitry 103B to first circuitry 103A. Consistent with the nomenclature used in the present patent application, the first and second synchronizer circuits may also be referred to as link-to-core synchronizer and core-to-link synchronizer circuits, respectively. In addition, the core clock synchronizer controller 124 also generates a set of inter-controller control signals that are provided to the first synchronizer controller 122 (i.e., link clock synchronizer controller) such that both controllers can work together. Reference numeral 128 refers to the signal path of the inter-controller control signal(s) provided between the link clock synchronizer 122 and the core clock synchronizer controller 124.

Similar to the operation of the link clock synchronizer controller 122, the core clock synchronizer controller 124 is operable responsive to the distributed core_clock, c 106', inter-controller control signals and sync_c pulse 118 to generate a plurality of synchronizer control signals, a portion of which signals are directed to the first synchronizer circuit means 105A and another portion of which signals are directed to the second synchronizer circuit means 105B. Reference numerals 138 and 140 refer to the respective signal paths relating to these control signals.

The link clock synchronizer controller 122 is also operable to generate data transmit/receive control signals that are provided to the link clock domain logic 103A via signal path 136 in order that the link clock domain logic 103A knows when it can send data to the core clock domain logic 103B (i.e., valid TX operations) and when it can receive data from the core clock domain logic 103B (i.e., valid RX operations).

Additionally, an optional phase detector 130 detects phase differences (i.e., skew) between the two clock signals by operating responsive to the sampled link_clock and core_clock signals. This information is provided to the link clock synchronizer controller 122, which can compensate for the skew or determine appropriate times to coordinate with the core clock synchronizer controller 124. Further details regarding the various sub-systems described hereinabove may be found in the following commonly owned co-pending patent application: PROGRAMMABLE CLOCK SYNCHRONIZER, "filed Jul. 30, 2003; application Ser. No. 10/630,159, in the name(s) of: Richard W. Adkisson; which is hereby incorporated by reference for all purposes.

As set forth above and in the cross-referenced U.S. patent application, the synchronizer system 100 may be programmed for different skew tolerances and latencies, so that data transfer at high speeds can proceed properly even where there is a high skew or requirement of low latency. Further, the synchronizer system 100 can operate with any two clock domains having a ratio of N first clock cycles to M second clock cycles, where N/M≧1. It should be appreciated that the synchronizer system 100 is presented by way of example and not by way of limitation. The synchronizer system 100 is one embodiment of a synchronizer system in which the sync pulse generation circuit 116 may be utilized. In this general regard, the link clock synchronizer controller 122, core clock synchronizer controller 124, link domain logic 103A, and first synchronizer 105A effectuate first synchronization circuitry which transfers data from the link clock domain to the core clock domain. Likewise, link clock synchronizer controller 122, core clock synchronizer controller 124, core domain logic 103B, and second synchronizer 105B effectuate second synchronization circuitry which transfers data from the core clock domain to the link clock domain.

Figure 2:
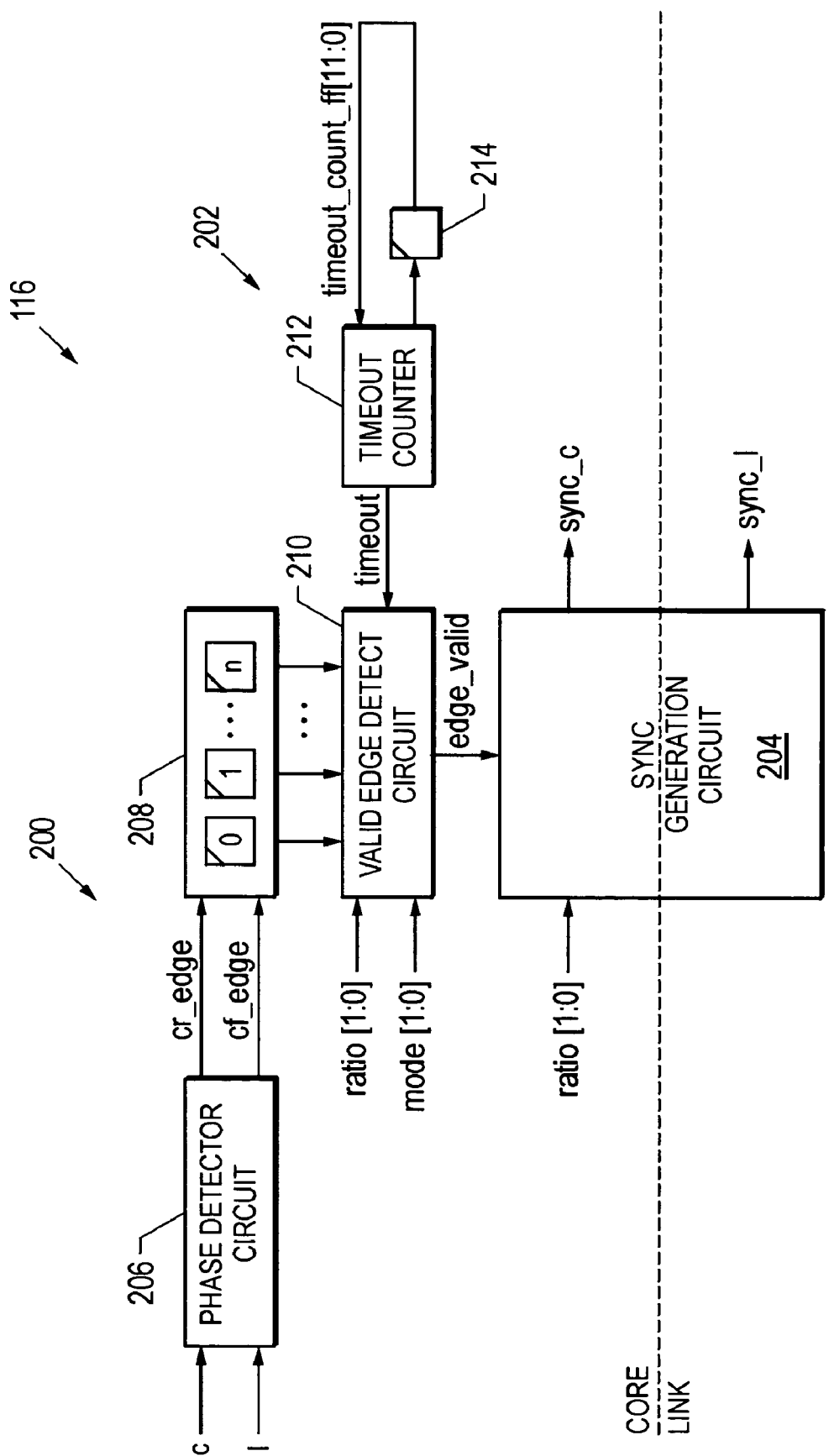
FIG. 2 depicts a functional block diagram of one embodiment of a sync pulse generator operable with the synchronizer system shown in FIG. 1.

FIG. 2 depicts a schematic diagram of one embodiment of the sync pulse generator 116 which includes internal phase detection circuitry 200, validation circuitry 202, and a sync generation circuit 204. The phase detection circuitry 200 includes a phase detector circuit 206 that is operable to sample the link clock signal with the core clock signal to determine coincident rising edges of the link and core clock signals. As illustrated, a cr_edge signal (a first sampled clock signal) and a cf_edge signal (a second sampled clock signal) asserted by the phase detector circuit are indicative of the coincident rising edges. Specifically, the cr_edge signal is generated by sampling the link clock signal with the rising edge of the core clock signal. In one embodiment, the cr_edge signal having a zero-to-one transition therein is asserted prior to an occurrence of the coincident rising edges between the link and core clock signals. On the other hand, the cf_edge signal is asserted upon sampling the link clock signal with the falling edge of the core clock signal. In one embodiment, similar to the cr-edge signal, the cf_edge signal having a one-to-zero transition therein is asserted prior to an occurrence of the coincident rising edges in the link and core clock signals.

The phase detection circuitry 200 also includes a staging register portion 208 which receives the cr_edge and cf_edge signals from the phase detector circuit 206. The staging register portion 208 may include any number of delay registers which appropriately delay the cr edge and cf_edge signals before the signals are processed by the validation circuitry 202. As will be explained in further detail hereinbelow, the number of registers employed is related to the ratio of the clock cycles between the link clock domain and the core clock domain. For example, in the case of a 5:4 ratio between the link clock domain and the core clock domain, six registers, i.e., registers 0 through 5, may be appropriate.

The validation circuitry 202 includes a valid edge detect circuit 210 and a timeout counter 212 having a register 214. The valid edge detect circuit 210 receives the delayed cr_edge and cf_edge signals as well as a ratio signal indicative of the ratio between the link clock and the core clock signals. Additionally, a mode signal is driven to the valid edge detect circuit to select the appropriate level of skew tolerance. In one embodiment, the mode signal is programmable. As will be further explained, the valid edge detect circuit 210 validates the coincident edges, e.g., coincident rising edges indicated by the cr_edge and cf_edge signals, based upon skew tolerance between the first and second clock signals. For example, in one exemplary mode of operation, the valid edge detect circuit 210 is operable to compensate for a skew of less than the following:

(period of the core clock signal)/2−(period of the link clock signal)/2

In another exemplary mode of operation, the valid edge detect circuit 210 and timeout counter 212 are operable to compensate for a skew of less the following:

(period of the core clock signal)−(period of the link clock signal)

Upon validating the coincident rising edges, the valid edge detect circuit 210 drives a valid edge signal; namely, edge_valid, which is received by the sync generation circuit 204 that generates synchronization pulses in both the link clock domain and core clock domain. The sync generation circuit 204 utilizes the ratio signal in conjunction with the edge_valid signal and a feedback loop to continuously generate the synchronization pulses in both the core and link clock domains. The synchronization pulses generated in the link clock domain are indicated as sync_1. Similarly, the synchronization pulses generated in the core clock domain are indicated as sync_c.

Figure 3:
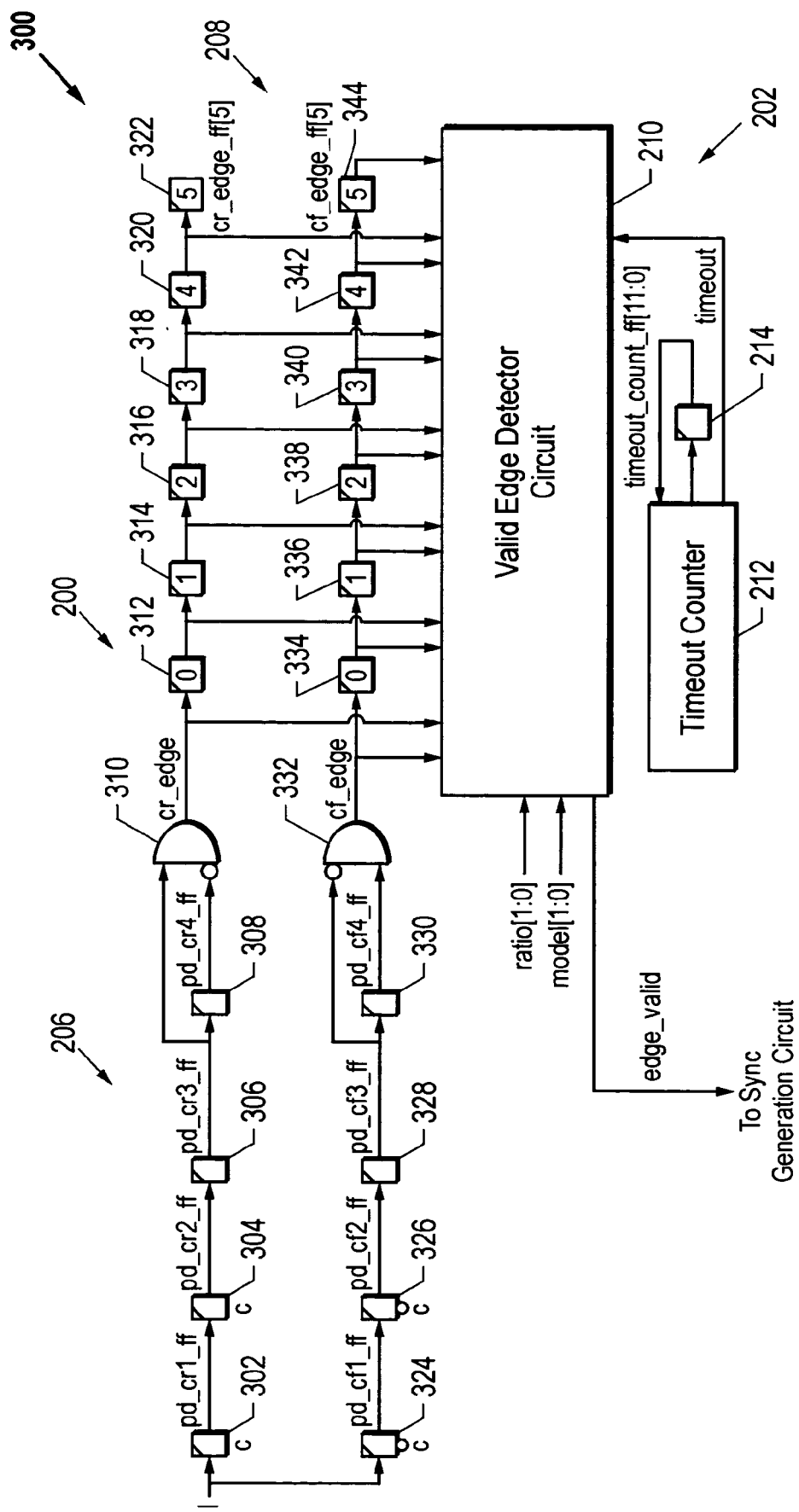
FIG. 3 depicts a schematic diagram of one embodiment of phase detection circuitry of the sync pulse generator shown in FIG. 2.

FIG. 3 depicts a block schematic diagram of one embodiment of a circuit portion 300 that includes the phase detection circuitry 200 operable to provide an indication of the coincident rising edges between the clocks used in the synchronizer system 100. As previously discussed, the phase detection circuitry 200 comprises phase detector circuit 206 and delay block 208 including at least one register. In general, the phase detector circuit 206 employs the rising and falling edges of the non-distributed core_clock 106 to sample the non-distributed link_clock 108. In one implementation, the equivalent distributed clock signals may be used instead. Accordingly, by way of illustrative implementation, the link_clock 1 108' is sampled by at least one first flip flop clocked on the rising edge of the core_clock c 106'. As illustrated, flip flops 302 and 304 sample the link_clock 1 108' with the rising edge of the core_clock c 106'. By employing two flip flops for sampling, the phase detector circuit 206 is able to decrease metastability. Flip flop 302 asserts the sampled link_clock 1 108' signal as a pd_cr1_ff signal which is sampled via the flip flop 304 and asserted as a pd_cr2_ff signal. A flip flop 306 maintains timing by staging the pd_cr2_ff signal such that a pd_cr3_ff signal is asserted which is driven to a flip flop 308 and an AND gate 310. The AND gate 310 has a second input, which is inverted, supplied by a pd_cr4_ff signal generated by the flip flop 308. The AND gate 310 asserts the cr_edge signal when the pd_cr3_ff signal is asserted and the pd_cr4_ff signal is deasserted. Hence the cr_edge signal is asserted having a zero-to-one transition that is indicative of coincident rising edges between the first and second clock signals. The cr_edge signal is driven to the delay register block 208 which, as illustrated, includes a sequence of flip flops 312-322 each having a tap that provides an input to the valid edge detector circuit 210. Specifically, the flip flop 312 receives the cr_edge signal and asserts a cr_edge_ff[0] signal which is sent to the flip flop 314 and the valid edge detector circuit 210. Similarly, the flip flop 314 asserts a cr_edge_ff[1] signal, the flip flop 316 asserts a cr_edge_ff[2] signal, the flip flop 318 asserts a cr_edge_ff[3] signal, the flip flop 320 asserts a cr_edge_ff[4] signal, and the flip flop 322 asserts a cr_edge_ff[5] signal. In one embodiment, the asserted sampled clock signal (i.e., cr_edge) may be registered N+1 times, wherein, for example, N+1 is 6 if 5:4 is the largest ratio detected. Taps are selected off the registers and implemented by the valid edge detector circuit 210 using a scheme that will be described in greater detail hereinbelow.

Similarly, the link_clock 1 108' is sampled by at least one second flip flop clocked on the falling edge of the core_clock c 106'. As illustrated, flip flops 324 and 326 sample the link_clock 1 108' with the falling edge of the core_clock c 106'. Flip flop 324 asserts the sampled link_clock 1 108' signal as a pd_cf1_ff signal which is sampled and asserted by the flip flop 326 as a pd_cf2_ff signal. A flip flop 328 delays the pd_cf2_ff signal to ensure timing and asserts a pd_cf3_ff signal that is received by a flip flop 330 and an AND gate 332. The AND gate inverts the pd_cf3_ff input and receives a second input signal from the flip flop 330 in the form of a pd_cf4_ff signal. The AND gate 332 asserts the cf_edge signal (i.e., the second sampled clock signal) indicative of coincident rising edges upon detecting an asserted logic low pd_cf3_ff signal and an asserted logic high pd_cf4_ff signal. Hence the cf_edge signal having a one-to-zero transition is asserted that is indicative of an occurrence of coincident rising edges between the first and second clock signals. The cf_edge signal is forwarded to the delay register block 208 which, as illustrated, includes a sequence of flip flops 334-344 each having a tap that provides an input to the valid edge detector 210 wherein the flip flops 334, 336, 338, 340, 342 and 344 assert cf_edge_ff[0], cf_edge_ff[1], cf_edge_ff[2], cf_edge_ff[3], cf_edge_ff[4] and cf_edge_ff[5] signals, respectively. In the illustrated embodiment, the phase detection circuitry 200 uses flip flops; however, it should be appreciated that the phase detection circuitry 200 may be realized in a variety of digital logic components such as latches, delay lines, et cetera. Moreover, although the phase detection circuitry 200 is described in relation to positive logic, negative logic may also be employed to determine the phase difference. It should be further appreciated that although the logic herein is described relative to coincident rising edges, the teachings of the present patent application are applicable to coincident falling edges as well.

Figure 4:
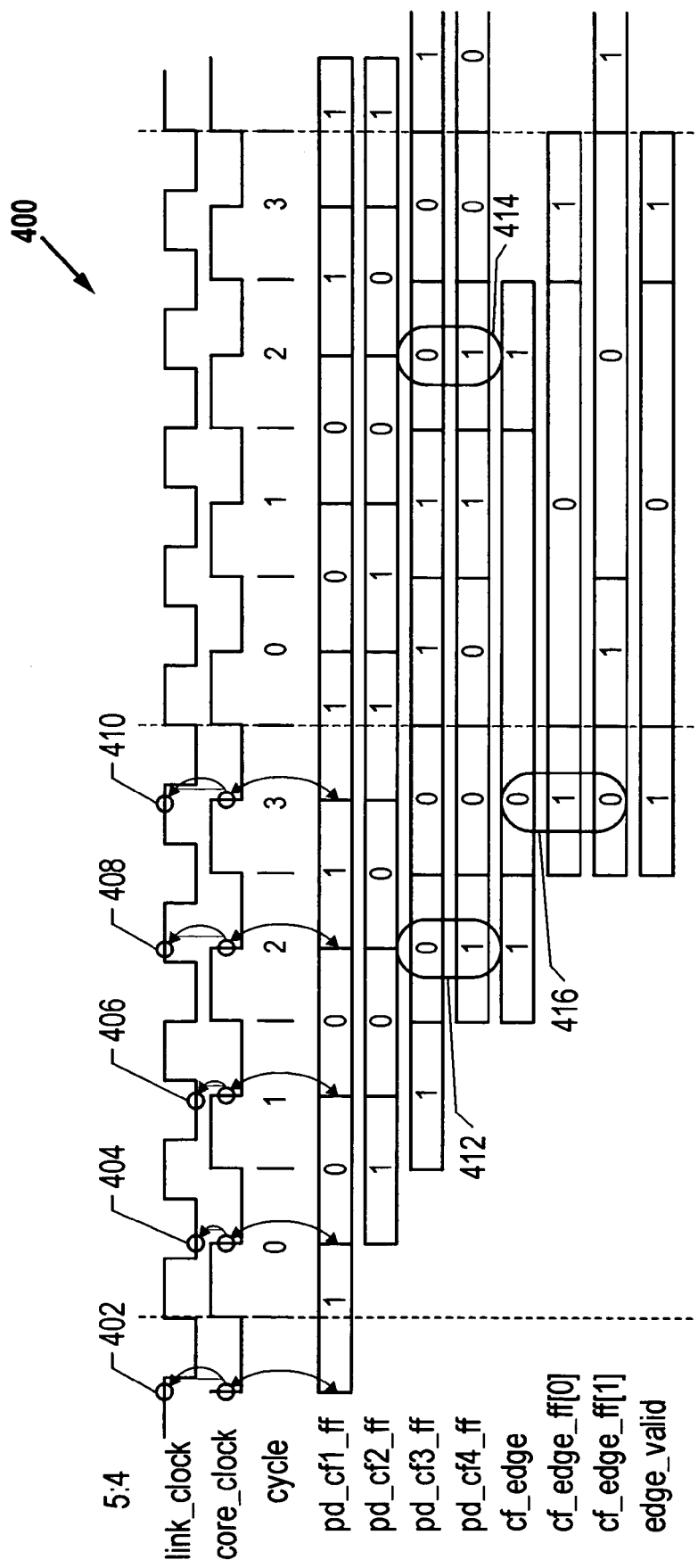
FIG. 4 depicts a timing diagram associated with the phase detection circuitry of FIG. 3.

FIG. 4 depicts a timing diagram 400 associated with the circuit portion 300 of FIG. 3 wherein a clock frequency ratio of 5:4 is exemplified between the link_clock signal and core_clock signal. A cycle count refers to the numbering of core_clock cycles in a particular timing sequence. In particular, the timing diagram 400 illustrates the output of flip flops 324-330, AND gate 332, and flip flops 334 and 336 as pd_cf1_ff, pd_cf2_ff, pd_cf3_ff, pd_cf4_ff, cf_edge, cf_edge_ff[0], and cf_edge_ff[1], respectively. Additionally, the output of valid edge detector circuit 210 is represented as edge_valid. As illustrated, the signals include logic data levels comprising 0s or 1s. For purposes of explanation, only the timing diagram of the falling edge portion of the phase detection circuitry 200 is exemplified. It should be appreciated that the rising edge portion of the phase detection circuitry 200 has a similar operation (i.e., generation of the cr_edge signal and subsequent delay registration).

As previously discussed, the flip flop 324 samples the link clock signal 108' with the falling edge of the core clock signal 106' as indicated by reference numerals 402-410. In the illustrated embodiment, this produces a [1001] sequence of logic levels. Since the flip flop 326 samples the pd_cf1_ff signal also with the falling edge of the core clock signal 106', the levels of the pd_cf2_ff signal are shifted by one cycle. The flip flop 328 samples the pd_cf2_ff signal and delays the signal by a half-cycle, thereby shifting the data of the pd_cf3_ff by one-half of a cycle relative to the data of the pd_cf2_ff signal. The flip flop 330 samples the pd_cf3_ff and delays the signal by a full cycle. The data of the pd_cf4_ff signal of the flip flop 330 is therefore the data of the pd_cf3_ff signal shifted by one full cycle. The AND gate 332 receives both the pd_cf3_ff signal and the pd_cf4_ff signal and asserts logic level of 1 as the cf_edge signal when a one-to-zero transition is detected, i.e., when the pd_cf3_ff data is logic low and the pd_cf4_ff is asserted logic high. In the illustrated embodiment, this one-to-zero transition condition is indicated by reference numerals 412 and 414.

The detected transitions, which are indicative of coincident rising edges, are validated by the valid edge circuit 210 based on the mode of skew tolerance and the ratio. Continuing with the illustrated example, the cf_edge, cf_edge_ff[0], and cf_edge_ff[1] signals are forwarded to the valid edge detector circuit 210. No skew is present between the link_clock signal and the core_clock signal and, as mentioned, the clock ratio between the link_clock signal and the core_clock signal is 5:4. Hence, upon detecting a current falling edge condition, which will be explained in detail hereinbelow, the valid edge detector circuit asserts the edge_valid signal logic high.

As previously mentioned, the valid edge detector 210 may be set for any one of four modes of operation. An Assume Start Stable mode provides a skew tolerance of less than (core period/2−link period/2) or ⅛ of a link period for the 5:4 ratio. In this mode of operation, the coincident rising edges are validated upon a current falling edge condition as indicated by reference numeral 416 with which the following logic is associated:

~cf_edge & cf_edge_ff[0] & ~cf_edge_ff[1]

A second Assume Start Stable mode, i.e., an Assume Start Stable 2 mode, also provides a skew tolerance of less than (core period/2−link period/2) or ⅛ of a link period for the 5:4 ratio. In this mode of operation, the coincident rising edges are validated upon the aforementioned current falling edge combination being detected twice sequentially. For example, the current falling edge condition is detected in two sequential cycles, thereby minimizing the risk of detecting coincident edges caused by aliasing. A Wait-for-Zero mode provides a skew tolerance of less than (core period−link period) or ⅖ of a link period at the 5:4 ratio. In this mode of operation, the valid edge signal (edge_valid) is asserted upon detecting a zero crossing condition in the sampled cr_edge clock signal and a constant falling edge condition in the sampled cf_edge clock signal. A second Wait-for-Zero mode, i.e., a Wait-for-Zero 2 mode, also provides a skew tolerance of less than (core period−link period) or ⅖ of a link period at the 5:4 ratio. In the second Wait-for-Zero mode, the valid edge detector circuit asserts the edge_valid signal after detecting a zero crossing condition in the sampled cr_edge clock signal and a constant falling edge condition in the sampled cf_edge clock signal. Alternatively, the edge_valid signal may be generated in this mode after a timeout when no zero crossing is detected after a specified period of time. Specifically, timeout counter 212 (shown in FIG. 2), which utilizes a feedback loop that in one embodiment includes a timeout_count_ff[11:0] signal, asserts the timeout signal after the specified period of time lapses. Once the timeout period occurs, the valid edge detector shifts to the Assume Start Stable 2 mode.

Figure 5A:
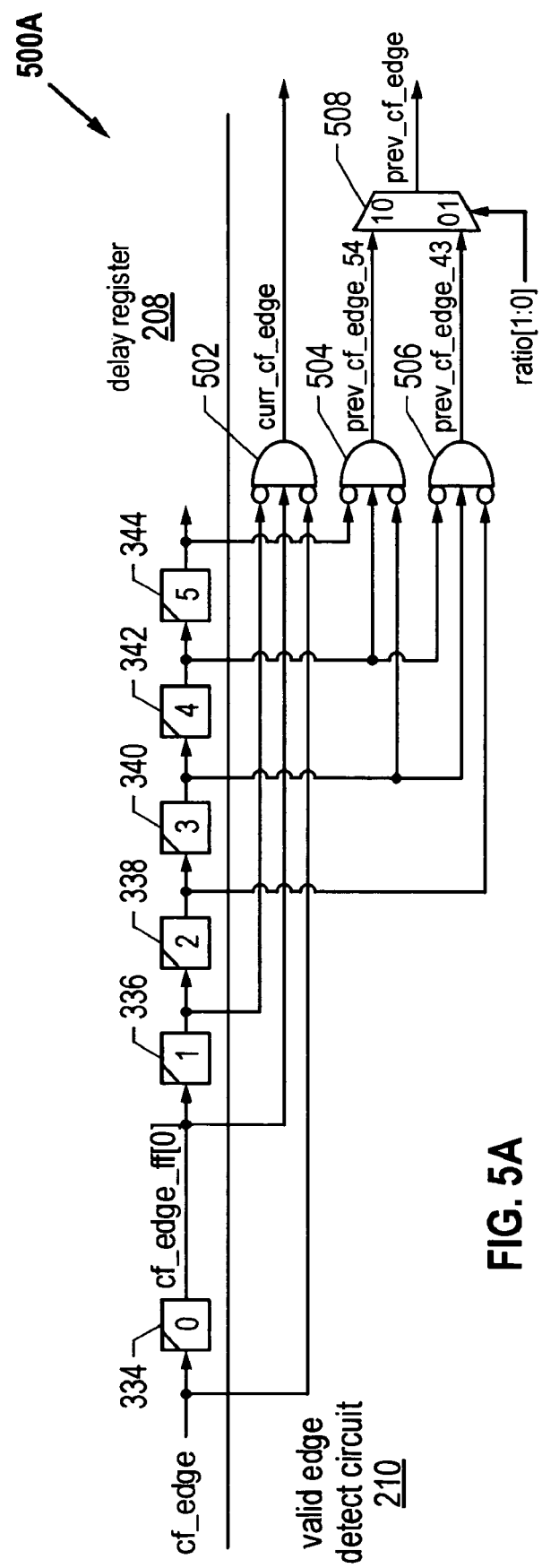
FIG. 5A depicts a schematic diagram of a portion of one embodiment of validation circuitry of the sync pulse generator shown in FIG. 3.

FIG. 5A depicts a schematic diagram of a circuit block 500A which forms a part of the synchronization pulse generation circuit 116. As previously discussed, the cf_edge signal is driven from phase detector circuit 206 to at least one delay register 208 which in one embodiment includes a plurality of flip flops 334-344. The valid edge detect circuit 210 includes AND gates 502-506 which receive taps from the flip flops 334-344. The AND gate 502 asserts a cur_r_cf_edge signal upon detecting a current falling edge condition. The first input of the AND gate 502 is the inverted cf_edge_ff[1] signal provided by the flip flop 336. The second input is the cf_edge_ff[0] signal provided by the flip flop 334 and the third input is the inverted cf_edge signal. Hence, the logic for detecting the current falling edge condition is as follows:

~cf_edge_ff[1] & cf_edge_ff[0] & ~cf_edge

The AND gate 504 asserts a prev_cf_edge_54 signal upon detecting a previous falling edge condition for a clock ratio of 5:4. The first input provided to the AND gate 504 is the inverted cf_edge_ff[5] signal from the flip flop 344. The second input is the cf_edge_ff[4] signal from the flip flop 342 and the third input is the inverted cf_edge_ff[3] signal from the flip flop 340. Therefore, the logic for detecting the previous falling edge condition for a clock ratio of 5:4 is as follows:

~cf_edge_ff[5] & cf_edge_ff[3] & ~cf_edge_ff[3]

The AND gate 506 asserts a prev_cf_edge_43 signal upon detecting a previous falling edge condition for a clock ratio of 4:3. The first input provided to the AND gate 506 is the inverted cf_edge_ff[4] signal from the flip flop 342. The second input is the cf_edge_ff[3] signal from the flip flop 340 and the third input is the inverted cf_edge_ff[2] signal from the flip flop 338. Therefore, the logic for detecting the previous falling edge condition for a clock ratio of 4:3 is as follows:

~cf_edge_ff[4] & cf_edge_ff[3] & ~cf_edge_ff[2]

A multiplexer (MUX) circuit 508, which is under the control of the ratio signal, receives the prev_cf_edge_54 signal and the prev_cf_edge_43 signal. When the clock ratio between the link clock domain and the core clock domain is 5:4, the ratio signal is set to [10]. On the other hand, when the clock ratio is 4:3, the ratio signal is set to [01]. Under the control of the ratio signal, the MUX circuit 508 appropriately selects the prev cf_edge_54 signal or the prev_cf_edge_43 signal for assertion as a prev_cf_edge signal that is indicative of the previous falling edge condition discussed hereinabove. It should be appreciated that ratios other than 5:4 and 4:3 may be accommodated by increasing the number of AND gates and MUX circuits as well as increasing the width of the ratio signal.

Figure 5B:
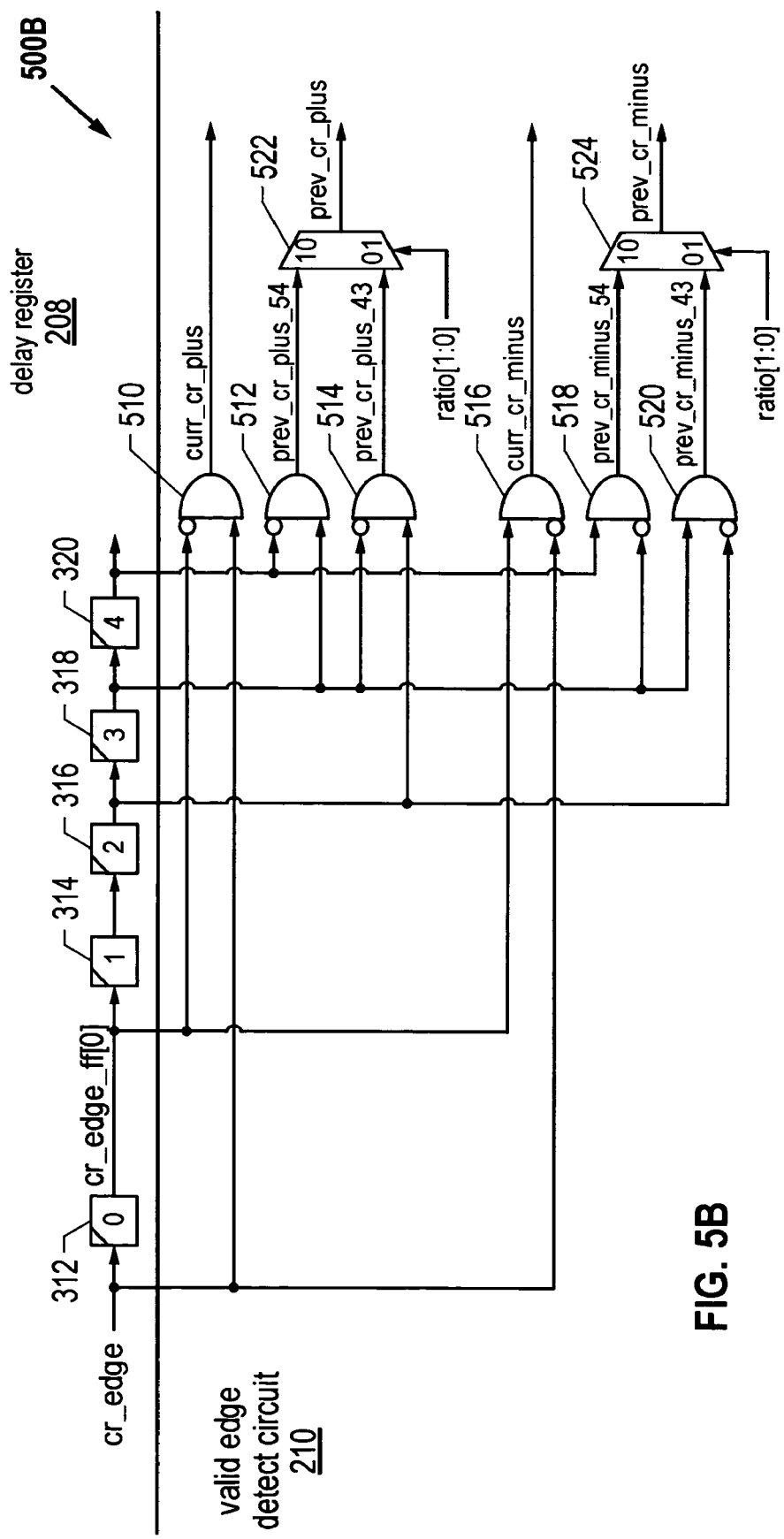
FIG. 5B depicts a schematic diagram of another portion of the validation circuitry illustrated in FIG. 5A.

FIG. 5B depicts a schematic diagram of a circuit block 500B which forms another part of the synchronization pulse generation circuit 116. Whereas FIG. 5A described above illustrated the processing of the cf_edge signal relative to falling edge conditions, FIG. 5B illustrates the processing of the cr_edge signal relative to rising edge conditions. The circuit block 500B includes a portion of the delay register 208 including flip flops 312-320. Additionally, a portion of the valid edge detect circuit 210 having a plurality of AND gates is included in the circuit block 500B. Specifically, AND gates 510-520 process the signals provided by the taps from the delay register 208. Further, MUX circuits 522-524 process the signals generated by corresponding segments of the AND gates 510-520.

The AND gate 510 generates a curr_cr_plus signal indicative of a current rising edge plus condition. The cr_edge_ff[0] signal provides a first input to the AND gate 510 that is inverted. The cr_edge signal provides a second input to the AND gate 510. Hence, the logic for detecting the current rising edge plus condition is as follows:

~cr_edge_ff[0] & cr_edge

The AND gate 512 asserts a prev_cr_plus_54 signal indicative of a previous rising edge plus condition for a 5:4 clock ratio by ANDing the inverted cr_edge_ff[4] signal with the cr_edge_ff[3] signal. Similarly, the AND gate 514 asserts a prev_cr_plus_43 signal indicative of a previous rising edge plus condition for 4:3 clock ratio by ANDing the inverted cr_edge_ff[3] signal with the cr_edge_ff[2] signal. The MUX circuit 522 under the control of the ratio signal appropriately selects the prev_cr_plus_54 signal or the prev_cr_plus_43 signal depending on the clock ratio.

The AND gate 516 asserts a curr_cr_minus signal indicative of a current rising edge minus condition by ANDing the cr_edge_ff[0] signal and inverted cr_edge signal. The AND gate 518 asserts a prev_cr_minus_54 signal indicative of a previous rising edge minus condition for a 5:4 ratio by ANDing the cr_edge_ff[4] signal and inverted cr_edge_ff[3] signal. The AND gate 520 asserts a prev_cr_minus_43 signal indicative of a previous rising edge minus condition for a 4:3 ratio by ANDing the cr_edge_ff[3] signal and inverted cr_edge_ff[2] signal. The MUX circuit 524 under the control of the ratio signal appropriately selects the prev_cr_mins_54 signal or the prev_cr_minus_43 signal depending on the clock ratio.

Figure 5C:
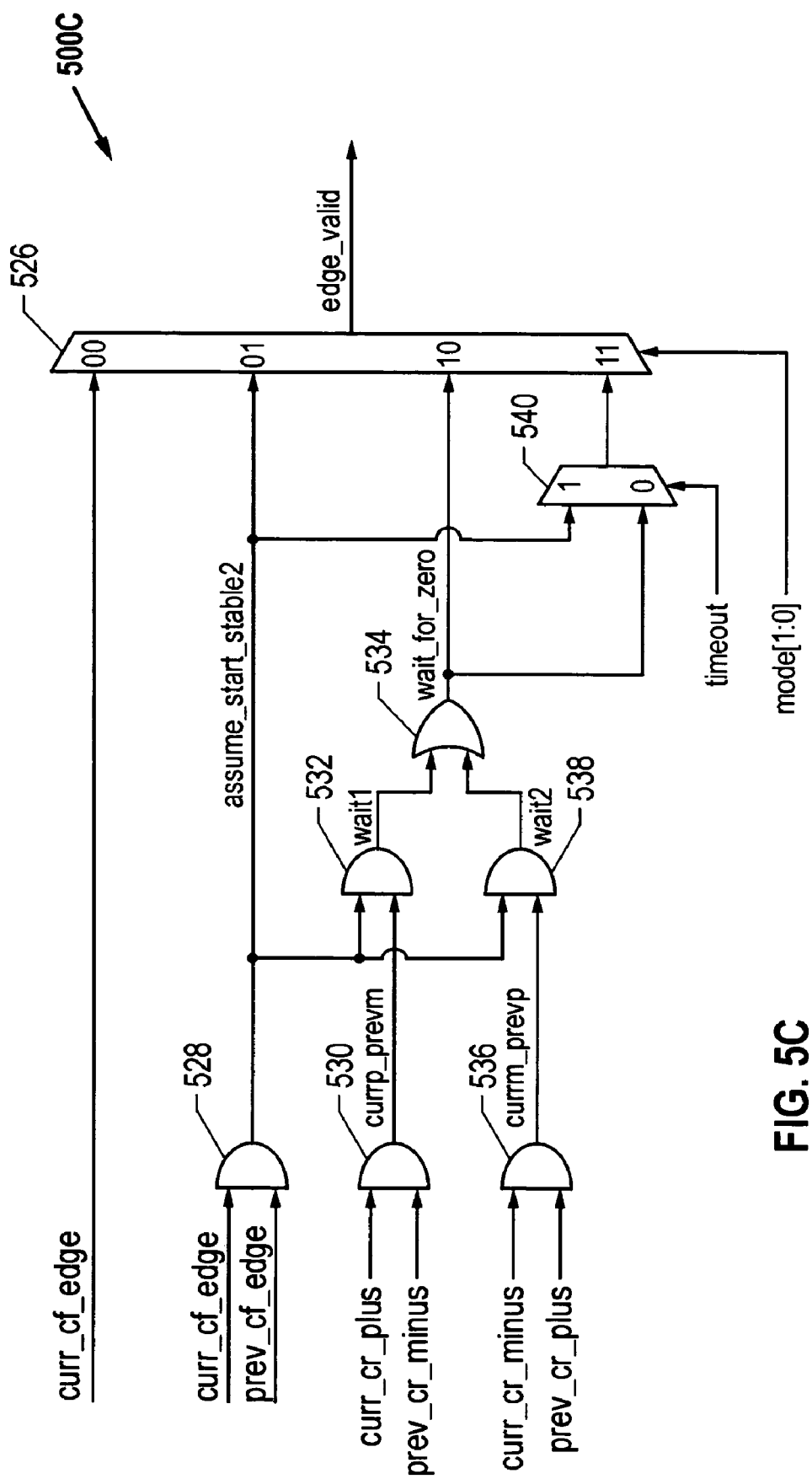
FIG. 5C depicts a schematic diagram of another portion of the validation circuitry illustrated in FIG. 5A.

FIG. 5C depicts a circuit block 500C defining a further potion of the valid edge detect circuit 210. MUX circuit 526, which is under the control of the mode signal, determines the operational mode of the valid edge detect circuit 210 as described by the following table:

TABLE 1

| Mode Signal and Operation Mode | |
|---|---|
| Mode Signal [1:0] | Selected Operational Mode |
| 00 | Assume Start Stable |
| 01 | Assume Start Stable 2 |
| 10 | Wait-for-Zero |
| 11 | Wait-for-Zero 2 |

With respect to the Assume Start Stable mode, when the mode signal is set to [00], the curr_cf_edge signal is selected and asserted as the edge_valid signal. The logic for the Assume Start Stable mode is as follows:

~cf_edge_ff[1] & cf_edge_ff[0] & ~cf_edge

With respect to the Assume Start Stable 2 mode, when the mode signal is set to [01], an AND gate 528 ANDs the curr_cf_edge signal and the prev_cf_edge signal provided by the MUX circuit 508 to assert an assume_start_stable2 signal which in turn, is asserted as the edge_valid signal by the MUX circuit 526. In the Assume Start Stable 2 mode, both the current falling edge condition and previous falling edge condition must be satisfied before the edge_valid signal is asserted. This ensures that the skew has changed little between the two samples and thus avoids aliasing. By way of example, the logic for the Assume Start Stable 2 mode for the 5:4 ratio is as follows:

(~cf_edge_ff[1] & cf_edge_ff[0] & ~cf_edge) &
(~cf_edge_ff[5] & cf_edge_ff[4] & ~cf_edge_ff[3])

With respect to the Wait-for-Zero mode, when the asserted mode signal is [10], an AND gate 530 ANDs the curr_cr_plus signal provided by the AND gate 510 and the prev_cr_minus signal provided by the MUX circuit 524 to assert a currp_prevm signal. An AND gate 532 ANDs the currp_prevm signal with the assume_start_stable2 signal to assert a wait1 signal which is forwarded to an OR gate 534. The second input of the OR gate 534 is generated by AND gates 536 and 538. Specifically, the AND gate 536 ANDs the curr_cr_minus signal provided by the AND gate 516 with the prev_cr_plus signal provided by the MUX circuit 522 to assert a currm_prevp signal. The AND gate 538 ANDs the assume_start_stable2 signal and the currm_prevp signal in asserting a wait2 signal.

The OR gate 534 ORs the wait1 signal and wait2 signal in asserting a wait_for_zero signal which, in the Wait-for-Zero mode, is selected by the MUX circuit 526 for assertion as the edge-valid signal. The Wait-for-Zero mode sets edge_valid upon the detection of a zero crossing condition which occurs when the rising edge jumps forward or backward between previous and current samples but the falling edge stays constant. As will be appreciated, the forward and backward jumps of the rising edge are detected by the logic associated with AND gates 530 and 536. By way of example, the logic for the Wait-for-Zero mode for the 5:4 ratio is as follows:

{[(~cr_edge_ff[0] & cr_edge) & (cr_edge_ff[4] &
~cr_edge_ff[3])] & assume_start_stable2} OR {[(cr_edge_ff[0] & ~cr_edge) & (~cr_edge_ff[4] &
cr_edge_ff[3])] & assume_start_stable2}

With respect to the Wait-for-Zero 2 mode, when the mode signal is asserted [11], the assume_start_stable2 signal provided by the AND gate 528 and the wait_for_zero signal provided by the OR gate 534 provide first and second inputs to a MUX circuit 540 that operates under the control of the timeout signal. The MUX circuit 540 enables the valid edge detector circuit 210 to switch from the Wait-for-Zero mode to the Assume Start Stable 2 mode if no zero crossing is detected after a predetermined timeout period as determined by the timeout counter 212 of FIG. 3. This mode of operation that includes the zero crossing timeout condition is particularly useful when a small offset is present and the skew is small enough that no zero crossing is going to occur. As opposed to waiting indefinitely for the zero crossing, which is not going to occur, the Wait-for-Zero 2 mode switches to the Assume Start Stable 2 mode.

Figure 6:
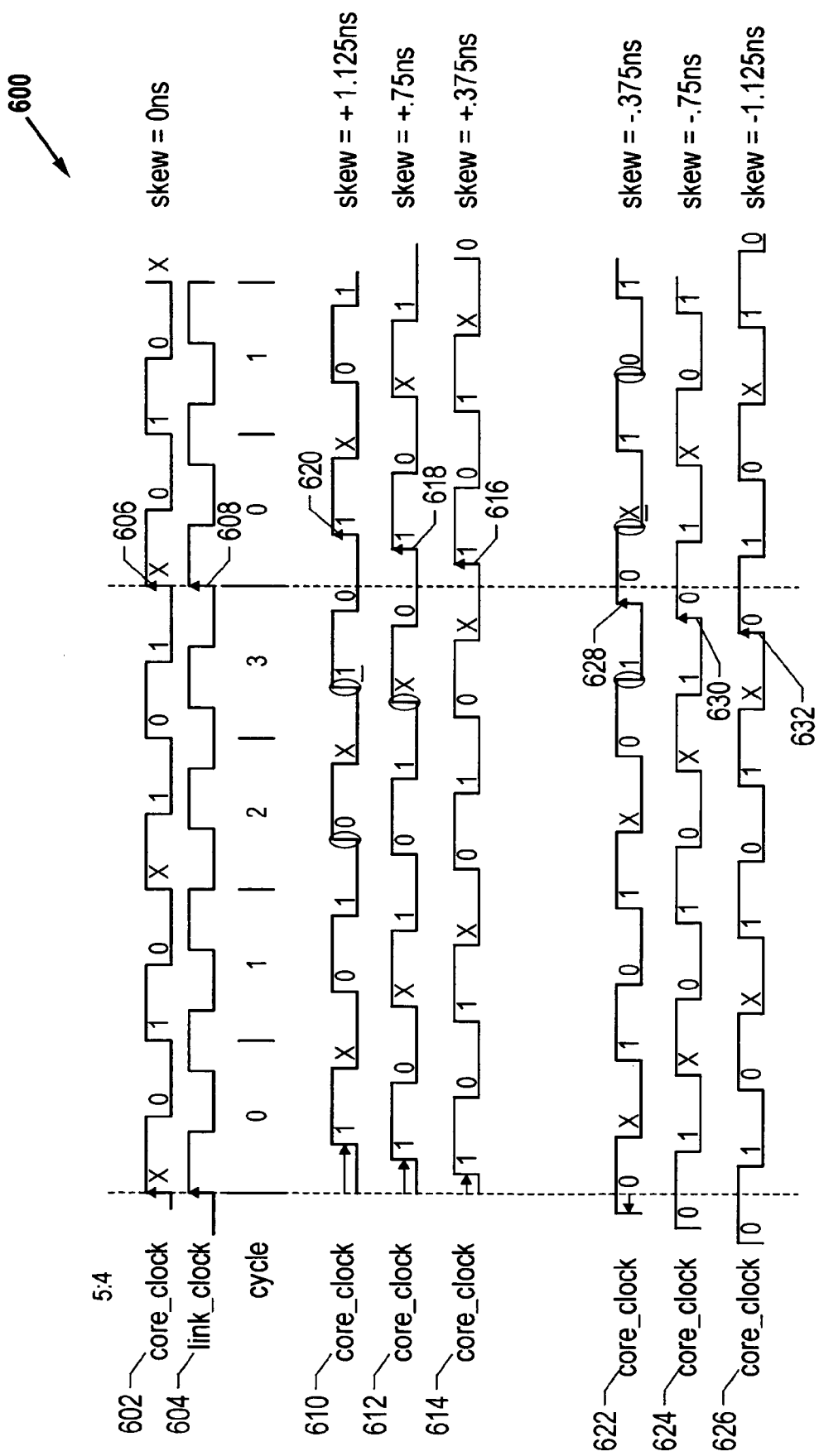
FIG. 6 depicts a timing diagram illustrating different skews that may associated with clock signals.

FIG. 6 depicts a timing diagram 600 illustrating different skews between the link and core clock signals for a 5:4 clock ratio. A cycle count refers to the numbering of core_clock cycles in a particular timing sequence. The coincident rising edges between a core_clock signal 602 and a link_clock signal 604 are represented by arrows 606 and 608, respectively, where there is no skew between the core_clock and the link_clock signals. As previously discussed, the synchronizer pulse generator circuit described herein is operable to compensate for various skews. By way of example, core_clock signals 610-614 represent skews of +1.125 ns, +0.75 ns, and +0.375 ns, respectively, where arrows 616-620 represent the rising edges with respect to rising edge 608 of the link_clock 604. Similarly, core_clock signals 622-626 represent skews of −0.375 ns, −0.75 ns, and −1.125 ns, respectively. For these negative skews, the corresponding rising edges in the core_clocks are represented by arrows 628-632. It should be appreciated that skews depicted in FIG. 6 are exemplary and other skews that may exist between the core_clock and the link_clock are within the teachings of the present patent application.

FIG. 7A depicts a table 700 further illustrating the different skews associated with rising clock edges of the signals depicted in FIG. 6. Rows 610*r*-614*r* are tabular representations of the logic levels and skew data associated with core_clock signals 610-614. Similarly, row 602*r* is a tabular representation of the data associated with core_clock signal 602 and rows 622*r*-624*r* are tabular representations of the data associated with core_clock signals 622-626. Columns 702-716 correspond to the cycle count and the number of core_clock cycles in a particular timing sequence. An "r" denotes rising, an "f" denotes falling (see FIG. 7B), a "p1" denotes plus one (+1) skew, "p2" denotes plus two (+2) skew, "m1" denotes minus one (−1) skew, and "m2" denotes minus two (−2) skew. Plus skew, or positive skew is defined as the condition where the link clock's normal coincident rising edge occurs first, followed by the corresponding rising edge in the core clock signal. Similarly, the minus or negative skew indicates that the core clock is leading the link clock. For example, the indication 3-rp1 in column 708 indicates that the cycle count for column 708 is 3 and for this cycle count the rising edge is plus one skew. Likewise, the indication 0-r0 in column 710 indicates that the cycle count for column 710 is 0 and for this cycle count the rising edge is not adjusted. In similar fashion, the indication 1-rm1 in column 712 indicates that the cycle count for column 712 is 1 and for this cycle the rising edge is minus 1 skew. Column 718 indicates the skew associated with a particular row in nanoseconds for a specific combination of frequencies and associated frequency ratio. Column 720 indicates the skew associated with a particular row in terms of the link clock and column 722 provides the general formula for the skew in terms of link and core periods.

The elongated circles indicate the locations of the sample edge detects and the underline indicates the cycle in which the coincident rising edges occur. By way of example, with respect to row 610*r*, the logic level sequence [10011001] corresponds to the logic levels generated by sampling link_clock 604 with the rising edge of core_clock 610. Within this sequence, the rising sampled edge occurs at the zero-to-one transition that occurs at cycles 2 and 3 as indicated by the elongated circle of logic levels in columns 706 and 708, respectively. The underline indicates that the rising edge occurs at cycle 3 (in column 708).

FIG. 7B depicts a table 750 further illustrating the different skews associated with falling clock edges of the signals depicted in FIG. 6. Similar to rows 610*r*-614*r* of FIG. 7A, rows 610*f*-614*f* are tabular representations of the logic levels and skew data associated with core_clock signals 610-614. Columns 752-766 correspond to the cycle count and the number of core_clock cycles in a particular timing sequence. Again, column 768 indicates the skew associated with a particular row in nanoseconds for a specific combination of frequencies and associated frequency ratio. Column 770 indicates the skew associated with a particular row in terms of the link clock and column 772 provides the general formula for the skew in terms of link and core clock periods. The elongated circles indicate the locations of the sample edge detects and the underline indicates the cycle in which the coincident falling edges occur. By way of example, the levels in row 622*f*, [X0X1X0X1], are indicative of the link_clock 604 being sampled with the falling edge of core_clock 622. It should be appreciated that the indicator X signifies the occurrence of an invalid cycle. The coincident edges are detected at cycle 0 as indicated by the encircled one-to-zero transition.

FIG. 8 depicts a table 800 illustrating the different skews associated with the rising and falling clock edges relative to operational modes of the validation circuitry. Rows 602, 610-614, and 622-626 represent a portion of the logic levels and skew data associated with core_clocks 602, 610-614, and 622-626. Columns 708-714 represent the link clock levels sampled on the rising core_clock edges as presented in FIG. 7A and columns 756-762 represent the link clock levels sampled on the falling core_clock edges as presented in FIG. 7B. Column 802 indicates for which skews the Wait-for-Zero (WFZ) mode and Wait-for-Zero 2 (WFZ2) mode are appropriate. Column 804 indicates for which skews the Assume Start Stable (SS) mode and Assume Start Stable 2 (SS2) mode are appropriate. Column 806 indicates the skew associated with a particular row as expressed in nanoseconds for a specific combination of frequencies and associated frequency ratio. Column 808 indicates the skew associated with a particular row in terms of the link clock and column 810 provides the general formula for the skew in terms of link and core clock periods.

In the illustrated tabular format, reference numeral 812 depicts the zero crossing condition that may be detected in either the Wait-for-Zero mode or Wait-for-Zero 2 mode. As may be recalled, the zero crossing condition occurs when the rising edge jumps forward or backward between previous and current samples but the falling edge stays constant. With respect to reference numeral 812, the rising edge is jumping between 0 and m1 and the falling edge is staying constant. Reference numeral 814 depicts the current falling edge condition that may be detected in the Assume Start Stable mode or Assume Start Stable 2 mode. As will be recalled, the current falling edge condition is exemplified by the detection of a clean falling edge that has no other falling edges about it.

Furthermore, those skilled in the art should appreciate upon reference hereto, in particular, the various MUX arrangements shown in FIGS. 5A-5C, that in Assume Start Stable and Assume Start Stable 2 modes, an embodiment of the present invention is operable with the falling edge sampling of the first clock signal alone during phase detection, thereby dispensing with the generation and propagation of the cr_edge signal. Additionally, although the link clock signal (i.e., the faster clock) is sampled using the core clock signal (i.e., the slower clock) in the illustrated embodiment of phase detection, it should be apparent that clock sampling may also be performed in opposite, i.e., the slower clock signal may be sampled using the faster clock signal for purposes of the present invention. Clearly, concomitant modifications will be required in the logic as well as signal levels and edges (i.e., with respect to falling/rising edges, logic highs and lows, et cetera), *mutatis mutandis*, in such an embodiment.

Figure 9:
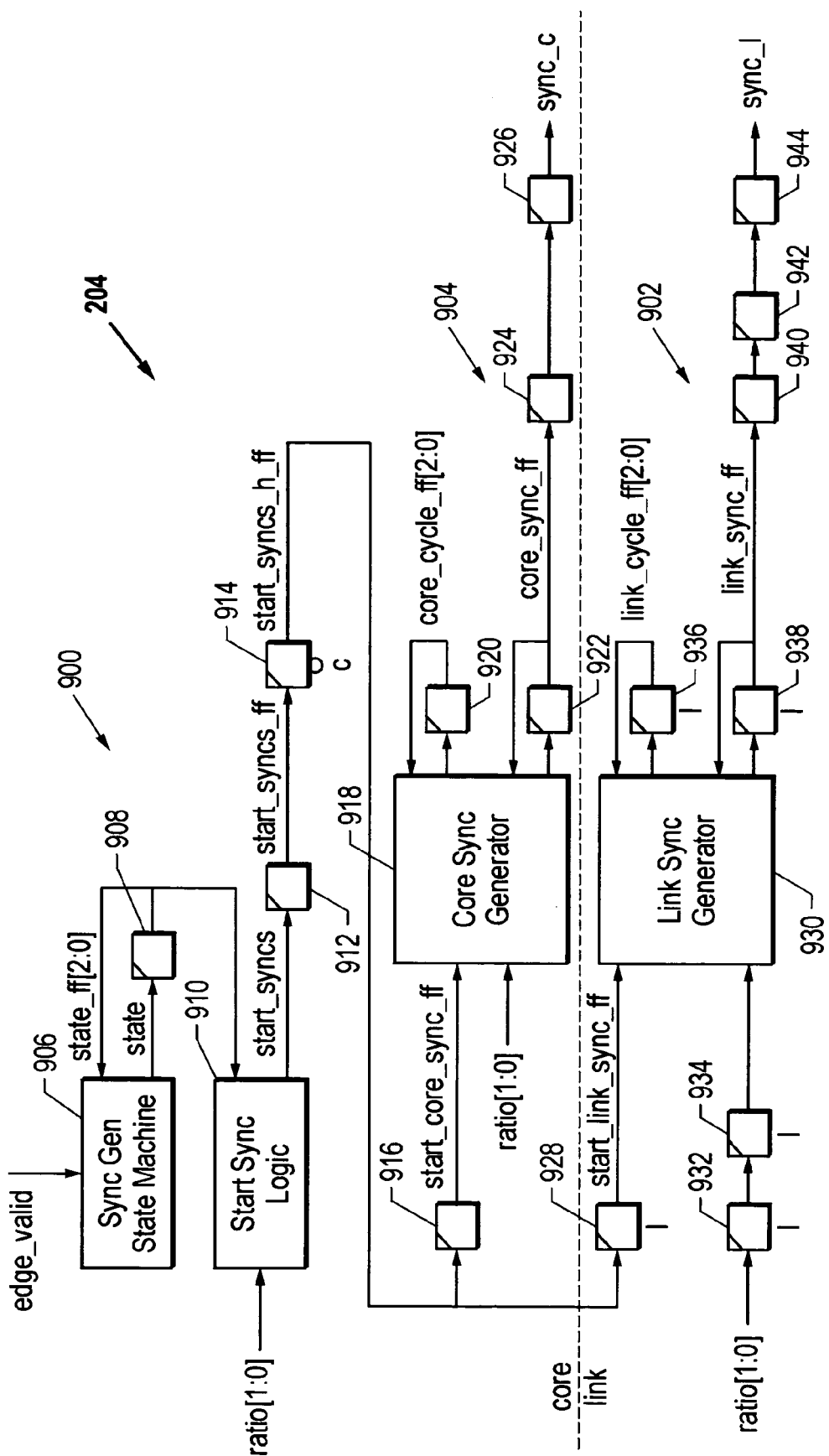
FIG. 9 depicts a block schematic diagram of one embodiment of sync generation circuitry.

FIG. 9 depicts one embodiment of sync generation circuit 204 which includes a sync circuit portion 900, a link sync generator circuit, i.e., first sync generator 902, and a core sync generator circuit, i.e., second sync generator, 904. The sync circuit portion 900 receives the edge_valid signal and generates a start_syncs_h_ff signal, i.e., a start sync signal, substantially centered around the coincident rising edges. More specifically, the edge_valid signal is received by a sync generation state machine 906 that generates a set of state signals indicative of a cycle count. In one embodiment, the state signal is a state_ff[2:0] signal. Each state signal is received by a flip flop 908 which asserts a state_ff signal that is fed back to the sync generation state machine 906 so that the sync generation state machine 906 can run through all of its states. The state_ff signal is also provided to a start sync logic circuit 910 that receives the ratio signal in order to generate a start_syncs signal, i.e., an initial start sync signal. A flip flop 912 delays the start_syncs signal by one cycle and forwards a start_syncs_ff signal to a flip flop 914 which samples the start_syncs_ff signal with the falling edge of the core_clock signal in order to shift the start_syncs_ff signal one-half of a cycle and assert the start_syncs_h_ff signal, which is substantially centered about the coincident rising edges.

As previously alluded to, the start_syncs_h_ff signal is forwarded to core sync generation circuitry 904 that includes a flip flop 916, a core sync generator 918, and flip flops 920-926. Initially, the flip flop 916 receives the start_syncs_h_ff signal, holds the start_syncs_h_ff signal for one cycle and asserts a start_core_sync_ff signal that is received by the core sync generator 918. The start_core_sync_ff signal initiates the core sync generator 918 which, based upon the ratio signal, produces a core_sync_ff signal that is staggered through flip flips 922-926 to produce a sync_c pulse in the core clock domain. As illustrated, the core_sync_ff signal returns to the core sync generator. Moreover, the core sync generator asserts a core_cycle_ff[2:0] signal that is sampled by flip flop 920 and returned to the core sync generator 918. The feedback loops provided for the core_cycle_ff signal and the core_sync_ff signal help maintain the pulse generation performance of the core sync generator 918.

Additionally, the start_syncs_h_ff signal is forwarded to link sync generation circuitry 902 that is disposed in the link clock domain. The circuitry of the link sync generation circuit 902 is analogous to that of the core sync generation circuit 904. A flip flop 928 receives the start_syncs_h_ff signal and asserts a start_link_sync_ff signal that is received by the link sync generator 930. A ratio signal is clocked with the link_clock signal by flip flops 932 and 934 before being provided to the link sync generator 930. The link sync generator 930 produces a link_sync_ff signal which is sampled with the link_clock by flip flop 938 and sampled with the link_clock by flip flops 940-944. The resulting sync_1 signal comprises the synchronization pulse for the link clock domain. Flip flop 936, which is associated with a link_cycle_ff signal, and flip flop 938, which is associated with the link_sync_ff signal, provide feedback loops with respect to the link sync generator 930.

One skilled in the art should recognize that the output-stage flip flop arrangement shown in FIG. 9, i.e., flip flops 924 and 926 in the path of sync_c and flip flops 940, 942 and 944 in the path of sync-1, is amenable to many variations and may be provided in one embodiment as part of the respective domain's delay/distribution tree depending on actual design implementation.

Figure 10:
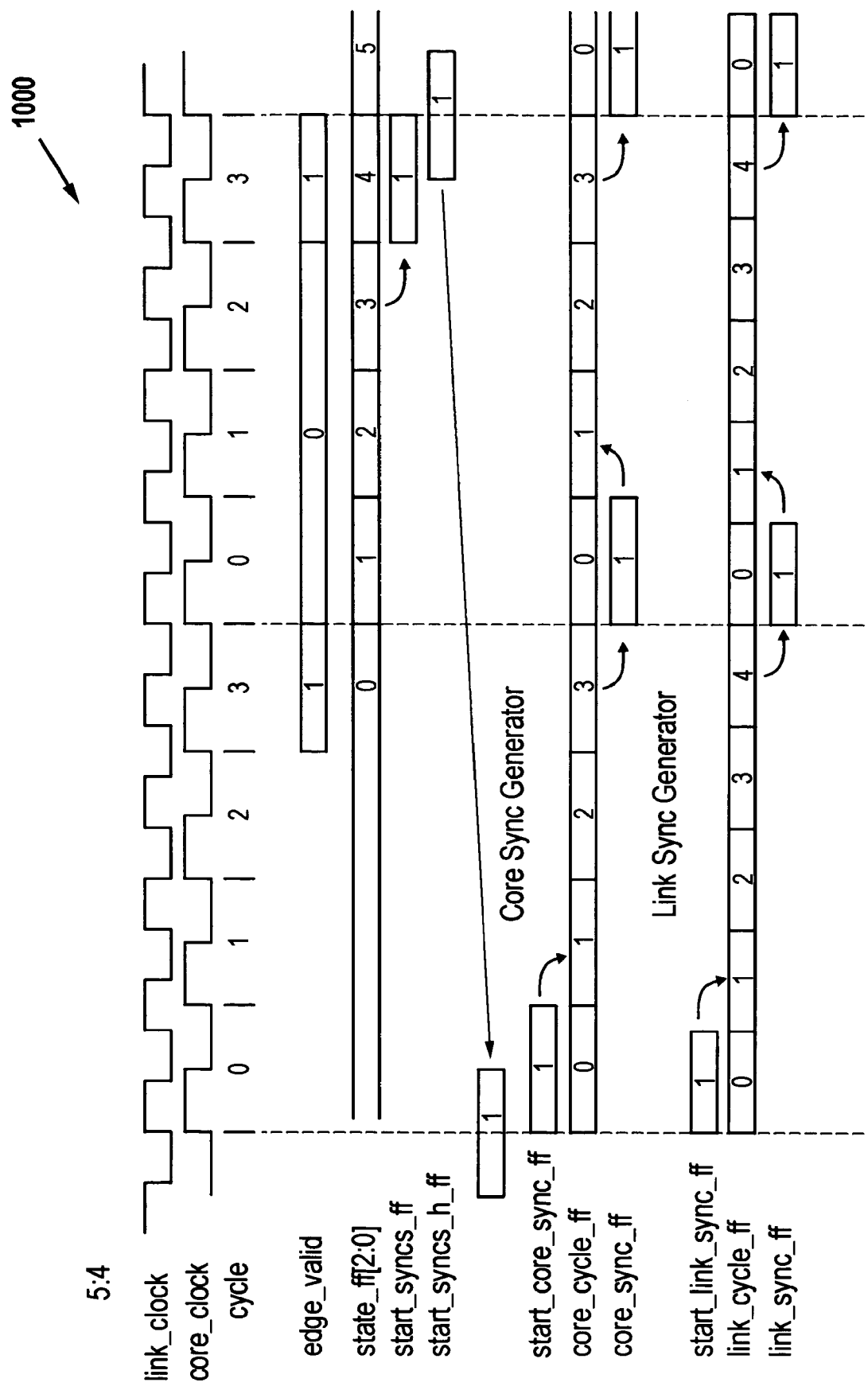
FIG. 10 depicts a timing diagram associated with the sync generation circuitry of FIG. 9.

FIG. 10 depicts a timing diagram 1000 associated with the sync generation circuit 204 of FIG. 9. Again, a clock frequency ratio of 5:4 is exemplified between the link_clock signal and core_clock signal. A cycle count refers to the numbering of core_clock cycles in a particular timing sequence. In particular, the timing diagram 1000 illustrates that the edge_valid signal is received by the sync generation state machine 906 which generates a state count for purposes of generating appropriate sync pulses in the link and core clock domains. Based on the ratio signal, the sync generation state machine counts from 0 to a maximum value (which is 7 in the illustrated embodiment due to state_ff[2:0]). The start sync logic circuit 910 (in FIG. 9) generates the start_syncs signal such that start_syncs_ff is asserted when state_ff[2:0] is 4 (which is cycle 3, i.e., the cycle before the coincident rising edges). The start_syncs_ff signal is delayed one-half of a cycle by flip flop 914. This results in the start_syncs_h_ff signal which is substantially centered about the coincident rising edges. With respect to the core synchronization circuit 904, the start_syncs_h_ff signal is delayed a further half cycle by flip flop 916. The start_core_sync_ff signal initiates the generation of the core_cycle_ff signal which initiates the generation of the core_sync_ff signal, which in turn initiates the generation of the core_cycle_ff signal, and so on. As explained before with respect to FIG. 9, the core_sync_ff signal is appropriately staged so as to be provided as the sync_c signal. Similarly, with respect to the link synchronization circuit 902, the start_syncs_h_ff signal is delayed a half cycle by flip flop 928. Thereafter, start_link_sync_ff signal initiates the generation of the link_cycle_ff signal which initiates the generation of the link_sync_ff signal, which in turn initiates the generation of the link_cycle_ff signal, and so on. Again, as before with respect to FIG. 9, the link_sync_ff signal is appropriately staged through flip flops 940-944 so as to be provided as the sync_1 signal.

Figure 11:
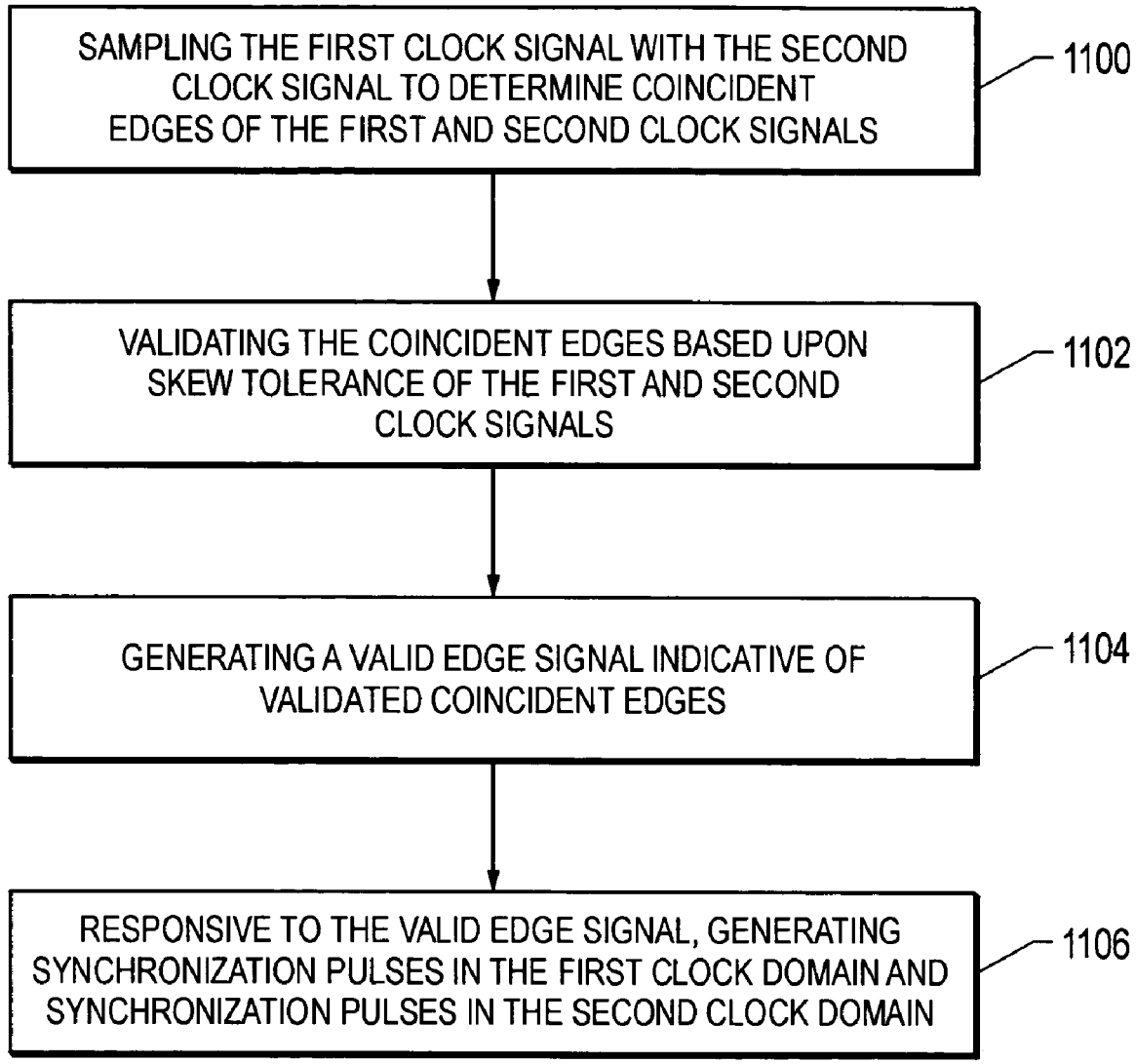
FIG. 11 depicts a flow chart of one embodiment of a sync pulse generation method.

FIG. 11 depicts one embodiment of a synchronizer pulse generation method. At block 1100, the first clock signal is sampled with the second clock signal to determine coincident rising edges of the first and second clock signals. At block 1102, the coincident rising edges are validated based upon skew tolerance between the first and second clock signals. At block 1104, a valid edge signal is generated that is indicative of validated coincident rising edges. The valid edge signal may be verified by either detecting coincident edges, e.g., Assume Start Stable or Assume Start Stable 2 modes, or detecting zero crossings, e.g., Wait-for-Zero or Wait-for-Zero 2 modes, thereby rejecting coincident edges that may be caused by clock signal aliasing. Hence, the several modes of operation provide greater skew tolerance in a configurable manner based on the appropriate clock ratios. At block 1106, responsive to the valid edge signal, synchronization pulses are generated in the first clock domain and synchronization pulses are generated in the second clock domain.

Figure 12:
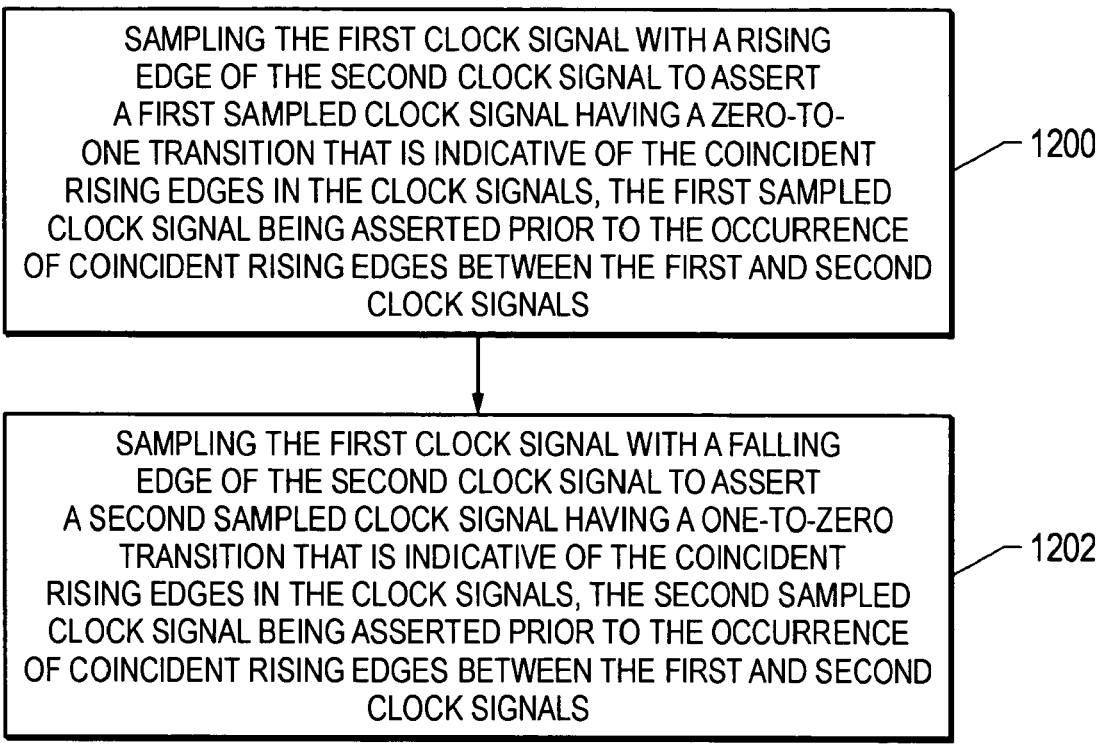
FIG. 12 depicts a flow chart of one embodiment of a phase detection method.

FIG. 12 depicts one embodiment of a phase detection method operable with the circuitry described hereinabove, in particular, with reference to FIGS. 2 and 3. At block 1200, the first clock signal is sampled with a rising edge of the second clock signal to assert a first sampled clock signal having a zero-to-one transition therein that is indicative of the coincident rising edges in the first and second clock signals. In one embodiment, the first sampled clock signal is asserted prior to an occurrence of coincident edges between the first and second clock signals. It should be appreciated that the logic may be configured relative to coincident rising or coincident falling edges. At block 1202, the first clock signal is sampled with a falling edge of the second clock signal to assert a second sampled clock signal having a one-to-zero transition therein that is indicative of the coincident rising edges in the clock signals. Similar to the first sampled clock signal, the second sampled clock signal may also be asserted prior to an occurrence of the coincident rising edges between the first and second clock signals. As mentioned with respect to block 1200, the present methodology may be effectuated relative to coincident rising or coincident falling edges. Accordingly, in this embodiment the synchronizer pulse generator detects coincident edges between two clocks by utilizing logic operating in the slower clock domain, thereby providing for better timing. In addition, by way of a still further embodiment, the methodology of the present invention may effectuated using only the second sampled clock signal in certain modes as alluded to hereinabove.

Figure 13:
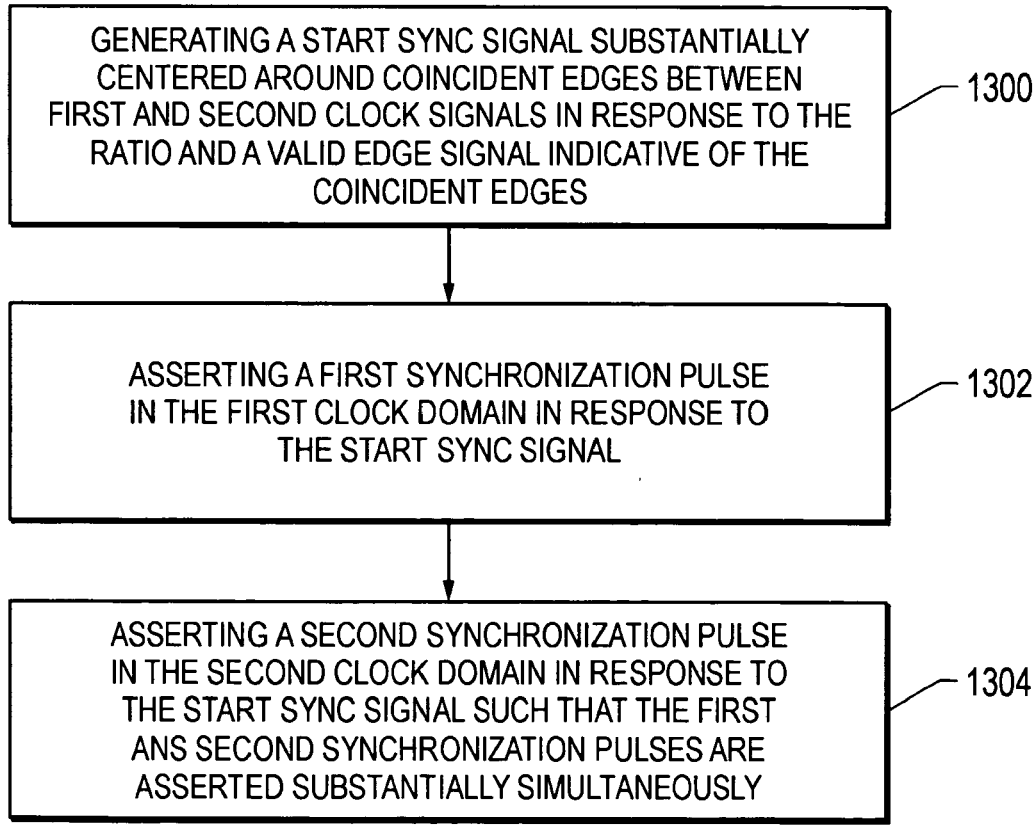
FIG. 13 depicts a flow chart of one embodiment of a sync generation method.

FIG. 13 depicts one embodiment of a sync generation method. At block 1300, a start sync signal is generated and substantially centered around coincident rising/falling edges between first and second clock signals in response to the ratio and a valid edge signal indicative of the coincident edges. At block 1302, a first synchronization pulse is asserted in the first clock domain in response to the start sync signal. At block 1304, a second synchronization pulse is asserted in the second clock domain in response to the start sync signal such that the first and second synchronization pulses are asserted substantially simultaneously. Accordingly, the systems and methods described herein permit skew-tolerant, high speed sync pulses to be generated from general PLLs that do not produce sync pulses. Moreover, the systems and methods described herein allow the skew between the clocks to drift (i.e., drift tolerance) even after the synchronizer pulse generator has initially detected coincident edges and started generating sync pulses accordingly.

Figure 14A:
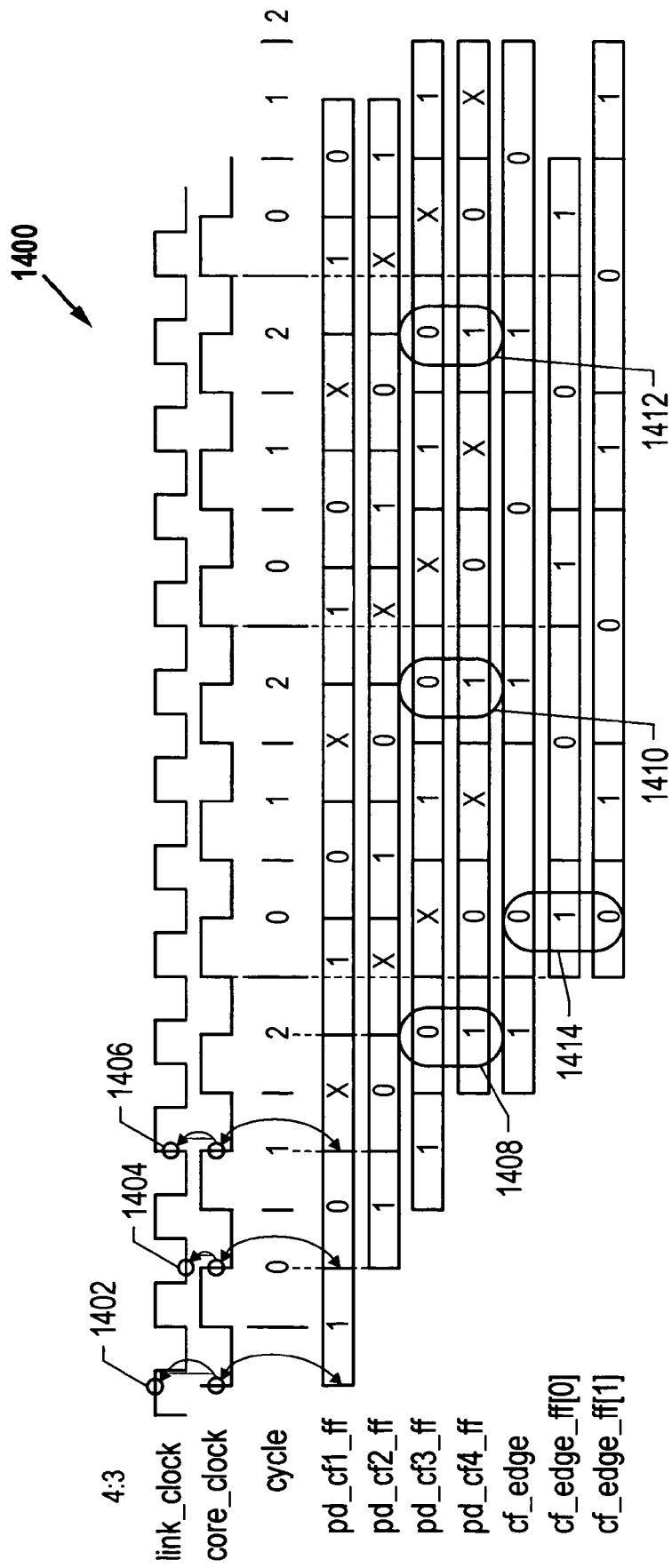
FIG. 14A depicts a portion of an additional timing diagram associated with one embodiment of the sync pulse generator of FIG. 2.

FIG. 14A depicts a portion of a further timing diagram 1400 associated with one embodiment of the synchronizer pulse generator wherein a clock frequency ratio of 4:3 is exemplified between the link_clock signal and core_clock signal. A cycle count refers to the numbering of core_clock cycles in a particular timing sequence. In particular, the timing diagram 1400 illustrates the output of flip flops 324-330, AND gate 332, and flip flops 334 and 336 (shown in FIG. 3) as pd_cf1_ff, pd_cf2_ff, pd_cf3_ff, pd_cf4_ff, cf_edge, cf_edge_ff[0], and cf_edge_ff[1], respectively. Initially, the link_clock is sampled on the falling edges of the core_clock as represented by reference numerals 1402, 1404, and 1406, for example. It should be noted that the one-to-zero transitions are detected during cycle 2 as indicated by reference numerals 1408, 1410, and 1412. Additionally, as no skew is present between the illustrated link_clock and core_clock, the system is in a Assume Start Stable mode, wherein a falling edge combination corresponding to the logic combination {~cf_edge & cf_edge_ff & ~cf_edge_ff[1]} is detected as indicated by reference numeral 1414.

Figure 14B:
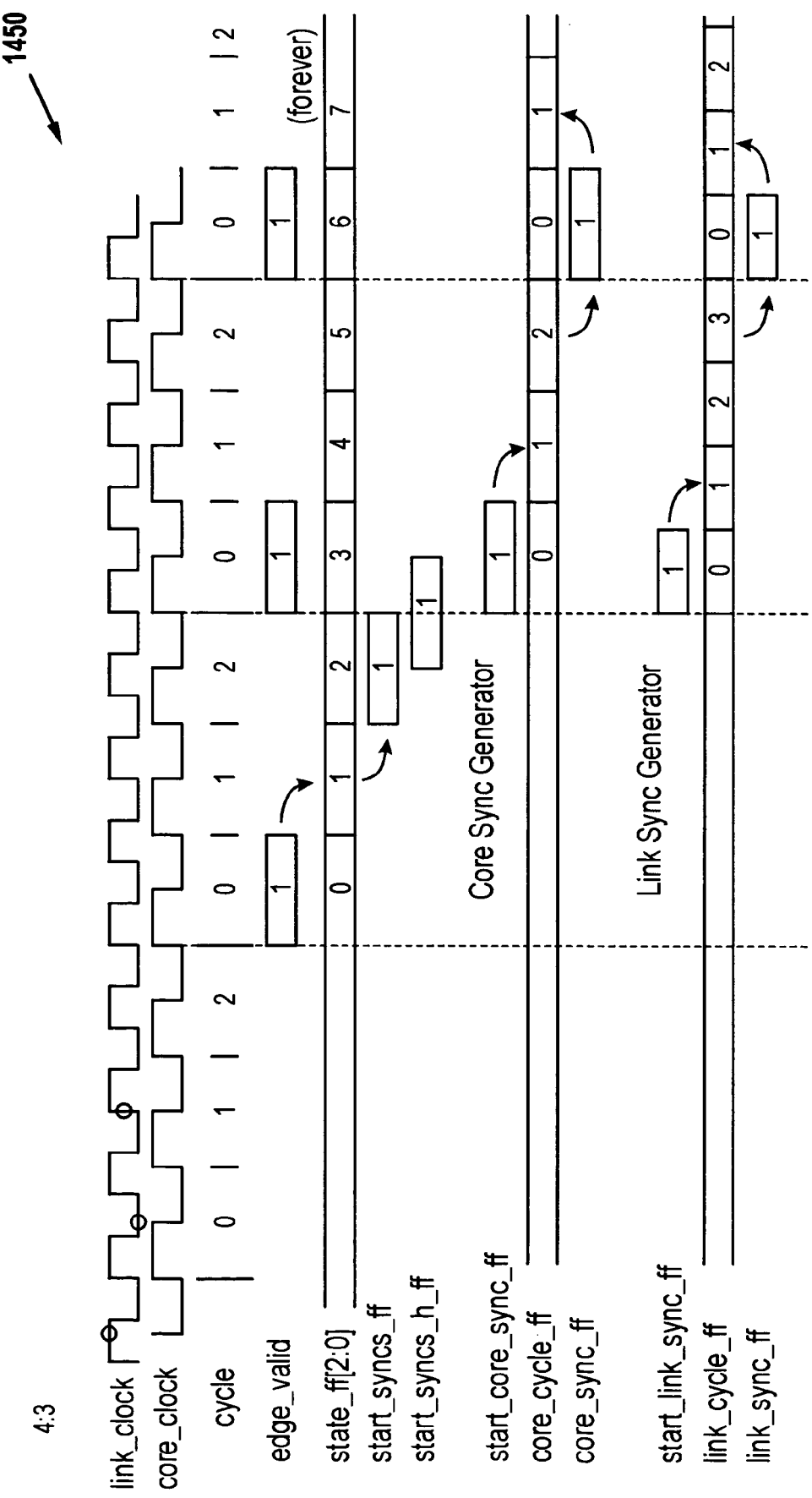
FIG. 14B depicts another portion of the timing diagram presented in FIG. 14A.

FIG. 14B depicts a timing diagram 1450 that continues the timing diagram 1400 presented in FIG. 14A. In this timing diagram, the output of valid edge detect circuit 210, sync generation state machine 906, start sync logic circuit 910, flip flop 912, and flip flop 914 are depicted as edge_valid, state_ff [2:0], start_syncs_ff, and start_syncs_h_ff, respectively. Further, with respect to the core synchronization circuitry 904, the output of flip flop 916, flip flop 920, and flip flop 922 are depicted as start_core_sync_ff, core_cycle_ff, and core_sync_ff, respectively. Similarly, with respect to the link synchronization circuitry 902, the output of flip flop 928, flip flop 936, and flip flop 938 is depicted as start_link_sync_ff, link_cycle_ff, and link_sync_ff, respectively. Accordingly, it should be appreciated that the synchronizer pulse generator described herein is applicable to any N:M clock domain ratios, including clock domain ratios other than 5:4.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A sync pulse generator operable in a clock synchronizer for effectuating data transfer between first circuitry disposed in a first clock domain and second circuitry disposed in a second clock domain, wherein said first clock domain is operable with a first clock signal and said second clock domain is operable with a second clock signal, said first and second clock signals having a ratio of N first clock cycles to M second clock cycles, where N/M≧1, comprising:
   phase detection circuitry operable to sample said first clock signal with said second clock signal to determine coincident edges of said first and second clock signals:
   validation circuitry operable to validate said coincident edges based upon skew tolerance between said first and second clock signals and to generate a valid edge signal responsive thereto; and
   sync generation circuitry, responsive to said valid edge signal, operable to generate synchronization pulses in said first clock domain and synchronization pulses in said second clock domain when said first and second clock signals have one of a coincident rising edge and a coincident falling edge.

2. The sync pulse generator as recited in claim 1, wherein said phase detection circuitry further comprises:
   a first logic portion for sampling said first clock signal with a rising edge of said second clock signal to assert a first sampled clock signal having a zero-to-one transition therein that is indicative of coincident rising edges in said first and second clock signals; and a second logic portion for sampling said first clock signal with a falling edge of said second clock signal to assert a second sampled clock signal having a one-to-zero transition therein that is indicative of coincident rising edges in said first and second clock signals.

3. The sync pulse generator as recited in claim 2, wherein said valid edge signal is asserted upon detecting a current falling edge combination with respect to said second sampled clock signal.

4. The sync pulse generator as recited in claim 3, wherein said current falling edge combination comprises a logic combination of {~cf_edge & cf_edge$_{13}$ ff[0]& ~cf_edge$_{13}$ff [1]}.

5. The sync pulse generator as recited in claim 3, wherein said valid edge signal is asserted upon detecting said current falling edge combination twice sequentially.

6. The sync pulse generator as recited in claim 2, wherein said valid edge signal is asserted upon detecting a zero crossing condition in said first sampled clock signal and a constant falling edge condition in said second sampled clock signal.

7. The sync pulse generator as recited in claim 2, wherein said valid edge signal is asserted after a timeout period during which no zero crossing condition is detected in said first sampled clock signal.

8. The sync pulse generator as recited in claim 1, wherein said skew tolerance is determined relative to said first clock signal's period.

9. The sync pulse generator as recited in claim 1, wherein said skew tolerance is determined relative to said second clock signal's period.

10. The sync pulse generator as recited in claim 1, wherein said first clock signal is a link clock signal operable in a computer system.

11. The sync pulse generator as recited in claim 1, wherein said second clock signal is a core clock signal operable in a computer system.

12. A clock synchronizer operating between a first clock domain having a first clock signal and a second clock domain having a second clock signal, said first and second clock signals having a ratio of N first clock cycles to M second clock cycles, where N/M24 1, said clock synchronizer comprising:

a phase locked loop operable to provide said first clock signal to a first clock tree and said second clock signal to a second clock tree;

a sync pulse generator operable to generate synchronization pulses in said first clock domain and synchronization pulses in said second clock domain, said synchronization pulses being indicative of coincident edges between said first clock signal and said second clock signal;

first synchronization circuitry in communication with said first clock tree, said first synchronization circuitry, responsive to said synchronization pulses, for effectuating data transfer from first circuitry disposed in said first clock domain to second circuitry disposed in said second clock domain; and second synchronization circuitry in communication with said second clock tree, said second synchronization circuitry, responsive to said synchronization pulses, for effectuating data transfer from said second circuitry disposed in said second clock domain to said first circuitry disposed in said first clock domain.

13. The clock synchronizer as recited in claim 12, wherein said phase-locked loop generates said first and second clock signals based on a system clock signal supplied thereto.

14. The clock synchronizer as recited in claim 12, wherein said sync pulse generator comprises:

phase detection circuitry operable to sample said first clock signal with said second clock signal to determine coincident edges of said first and second clock signals;

validation circuitry operable to validate said coincident edges based upon skew tolerance between said first and second clock signals and to generate a valid edge signal responsive thereto; and sync generation circuitry, responsive to said valid edge signal, operable to generate said synchronization pulses in said first clock domain and said synchronization pulses in said second clock domain.

15. The clock synchronizer as recited in claim 12, wherein said first clock signal is a link clock signal operable in a computer system.

16. The clock synchronizer as recited in claim 12, wherein said second clock signal is a core clock signal operable in a computer system.

17. The clock synchronizer as recited in claim 12, wherein said ratio of N:M cycles comprises a 5:4 link-to-core clock ratio operable in a computer system.

18. The clock synchronizer as recited in claim 12, wherein said ratio of N:M cycles comprises a 4:3 link-to-core clock ratio operable in a computer system.

19. A sync pulse generation method operable in a clock synchronizer for effectuating data transfer between first circuitry disposed in a first clock domain and second circuitry disposed in a second clock domain, wherein said first clock domain is operable with a first clock signal and said second clock domain is operable with a second clock signal, said first and second clock signals having a ratio of N first clock cycles to M second clock cycles, where N/M≧1, comprising:

sampling said first clock signal with said second clock signal to determine coincident edges of said first and second clock signals;

validating said coincident edges based upon skew tolerance between said first and second clock signals;

generating a valid edge signal indicative of validated coincident edges; and responsive to said valid edge signal, generating synchronization pulses in said first clock domain and synchronization pulses in said second clock domain when said first and second clock signals have one of a coincident rising edge and a coincident falling edge.

20. The method as recited in claim 19, wherein said operation of sampling said first clock signal with said second clock signal further comprises:

sampling said first clock signal with a rising edge of said second clock signal to generate a first sampled clock signal having a zero-to-one transition therein that is indicative of said coincident rising edges in said first and second clock signals; and sampling said first clock signal with a falling edge of said second clock signal to generate a second sampled clock signal having a one-to-zero transition therein that is indicative of said coincident rising edges in said first and second clock signals.

21. The method as recited in claim 20, wherein said operation of generating a valid edge signal further comprises asserting said valid edge signal upon detection of a current falling edge with respect to said second sampled clock signal.

22. The method as recited in claim 20, wherein said operation of generating a valid edge signal further comprises asserting said valid edge signal upon detection of said current falling edge combination twice sequentially.

23. The method as recited in claim 20, wherein said operation of generating a valid edge signal further comprises asserting said valid edge signal upon detection of a zero crossing condition in said first sampled clock signal and a constant falling edge condition in said second sampled clock signal.

24. The method as recited in claim 20, wherein said operation of generating a valid edge signal further comprises asserting said valid signal after a timeout period during which no zero crossing condition is detected in said first sampled clock signal.

25. The method as recited in claim 19, wherein said skew tolerance is determined relative to said first clock signal's period.

26. The method as recited in claim 19, wherein said skew tolerance is determined relative to said second clock signal's period.

27. The method as recited in claim 19, wherein said first clock signal is a link clock signal operable in a computer system.

28. The method as recited in claim 19, wherein said second clock signal is a core clock signal operable in a computer system.

29. A sync pulse generation system for a clock synchronizer operable in association with a first clock domain having a first clock signal and a second clock domain having a second clock signal, comprising:
   means for sampling said first clock signal with said second clock signal to determine coincident edges of said first and second clock signals;
   means for validating said coincident edges based upon skew tolerance between said first and second clock signals;
   means for generating a valid edge signal indicative of validated coincident edges; and
   means, responsive to said valid edge signal, for generating synchronization pulses in said first clock domain and synchronization pulses in said second clock domain when said first and second clock signals have one of a coincident rising edge and a coincident falling edge.

30. The system as recited in claim 29, wherein said means for sampling said first clock signal with said second clock signal further comprises:
   means for sampling said first clock signal with a rising edge of said second clock signal to generate a first sampled clock signal having a zero-to-one transition therein that is indicative of said coincident rising edges in said first and second clock signals; and
   means for sampling said first clock signal with a falling edge of said second clock signal to generate a second sampled clock signal having a one-to-zero transition therein that is indicative of said coincident rising edges in said first and second clock signals.

31. The system as recited in claim 30, wherein said means for generating a valid edge signal further comprises means for asserting said valid edge signal upon detection of a current falling edge with respect to said second sampled clock signal.

32. The system as recited in claim 30, wherein said means for generating a valid edge signal further comprises means for asserting said valid edge signal upon detection of said current falling edge combination twice sequentially.

33. The system as recited in claim 30, wherein said means for generating a valid edge signal further comprises means for asserting said valid edge signal upon detection of a zero crossing condition in said first sampled clock signal and a constant falling edge condition in said second sampled clock signal.

34. The system as recited in claim 30, wherein said means for generating a valid edge signal further comprises means for asserting said valid signal after a timeout period during which no zero crossing condition is detected in said first sampled clock signal.

35. The system as recited in claim 29, wherein said skew tolerance is determined relative to said first clock signal's period.

36. The system as recited in claim 29, wherein said skew tolerance is determined relative to said second clock signal's period.

37. The system as recited in claim 29, wherein said first clock signal is a link clock signal operable in a computer system.

38. The system as recited in claim 29, wherein said second clock signal is a core clock signal operable in a computer system.

* * * * *

UNITED STATES PATENT AND TRADEMARK OFFICE
CERTIFICATE OF CORRECTION

PATENT NO. : 7,382,847 B2  Page 1 of 1
APPLICATION NO. : 10/898404
DATED : June 3, 2008
INVENTOR(S) : Richard W. Adkisson et al.

It is certified that error appears in the above-identified patent and that said Letters Patent is hereby corrected as shown below:

In column 5, line 23, delete "cr-edge" and insert -- cr_edge --, therefor.

In column 5, line 31, delete "cr edge" and insert -- cr_edge --, therefor.

In column 8, line 14, delete "~cf_edge ff[1]" and insert -- ~cf_edge_ff[1] --, therefor.

In column 9, line 4, delete "~cf_edge_ff[5] & cf_edge_ff[3] & ~cf_edge_ff[3]" and insert -- ~cf_edge_ff[5] & cf_edge_ff[4] & ~cf_edge_ff[3] --, therefor.

In column 9, line 24, delete "prev cf_edge_54" and insert -- prev_cf_edge_54 --, therefor.

In column 10, line 63, delete "edge-valid" and insert -- edge_valid --, therefor.

In column 14, line 25, delete "sync~1," and insert -- sync_1, --, therefor.

In column 16, line 15, after "& cf_edge_ff" insert -- [0] --.

In column 16, line 53, in Claim 1, delete "signals:" and insert -- signals; --, therefor.

In column 17, lines 15-16, in Claim 4, delete "{~cf_edge & cf_edge$_{13}$ff[0]& ~cf_edge$_{13}$ff[1]}" and insert -- {~cf_edge & cf_edge_ff[0] & ~cf_edge_ff[1]} --, therefor.

In column 17, line 45, in Claim 12, delete "N/M24 1," and insert -- N/M $\geq$ 1, --, therefor.

Signed and Sealed this

Second Day of September, 2008

JON W. DUDAS
*Director of the United States Patent and Trademark Office*